(12) United States Patent
McIlrath

(10) Patent No.: US 9,275,185 B2
(45) Date of Patent: *Mar. 1, 2016

(54) METHODS AND SYSTEMS FOR COMPUTER AIDED DESIGN OF 3D INTEGRATED CIRCUITS

(71) Applicant: R3 Logic, Inc., Bedford, MA (US)

(72) Inventor: Lisa G. McIlrath, Lexington, MA (US)

(73) Assignee: R3 LOGIC, INC., Bedford, MA (US)

(*) Notice: Subject to any disclaimer, the term of this patent is extended or adjusted under 35 U.S.C. 154(b) by 78 days.

This patent is subject to a terminal disclaimer.

(21) Appl. No.: 14/161,895

(22) Filed: Jan. 23, 2014

(65) Prior Publication Data

US 2014/0137061 A1 May 15, 2014

Related U.S. Application Data

(60) Continuation of application No. 13/585,412, filed on Aug. 14, 2012, now Pat. No. 8,650,516, which is a continuation of application No. 13/218,581, filed on Aug. 26, 2011, now Pat. No. 8,266,560, which is a continuation of application No. 12/233,260, filed on Sep. 18, 2008, now Pat. No. 8,032,857, which is a division of application No. 11/485,883, filed on Jul. 13, 2006, now Pat. No. 7,526,739.

(60) Provisional application No. 60/702,364, filed on Jul. 26, 2005.

(51) Int. Cl.
 *G06F 17/50* (2006.01)

(52) U.S. Cl.
 CPC ........ *G06F 17/5081* (2013.01); *G06F 17/5045* (2013.01); *G06F 17/5068* (2013.01)

(58) Field of Classification Search
 CPC .. G06F 17/5081; G06F 17/5072; G06F 17/50
 USPC ................. 716/100–106, 110, 118–119, 126, 716/129–130
 See application file for complete search history.

(56) References Cited

U.S. PATENT DOCUMENTS

| | | | |
|---|---|---|---|
| 2005/0177268 A1* | 8/2005 | Morinaga et al. | ............. 700/121 |
| 2005/0223347 A1* | 10/2005 | Okuaki | ............................. 716/5 |
| 2009/0199147 A1* | 8/2009 | Jensen | ................ G06F 17/5045 716/119 |

* cited by examiner

*Primary Examiner* — Nghia Doan
(74) *Attorney, Agent, or Firm* — Brian Michaelis; Seyfarth Shaw LLP

(57) ABSTRACT

Methods and systems for generating and verifying circuit layouts from computer-aided design tools for vertically integrated, three-dimensional integrated circuits are disclosed. In one instance, a 3-D technology file of these teachings is obtained by providing an identifier for two or more circuit levels, providing for each one of the two or more circuit levels an identifier for a 2-D technology file corresponding to each of the one or more circuit levels and providing a file structure including the two or more circuit levels and each identifier, corresponding to each one of the one or more circuit levels, for the 2-D technology file corresponding to each one of the two or more circuit levels. Other embodiments are disclosed.

20 Claims, 23 Drawing Sheets

(Prior Art)

(Prior Art)

(Prior Art)

(Prior Art)

Create New Cell

Cell Name [cellA]

Select Technology:

● 3-D Technology

☐ Technology A

☐ Technology B

Fig. 17a

Select Drawing Level

Add Instance

Cell Name  | cellA |

METHODS AND SYSTEMS FOR COMPUTER AIDED DESIGN OF 3D INTEGRATED CIRCUITS

CROSS-REFERENCE TO RELATED APPLICATIONS

This application is a continuation of U.S. patent application Ser. No. 13/585,412 filed on Aug. 14, 2012 entitled "METHODS AND SYSTEMS FOR COMPUTER AIDED DESIGN OF 3D INTEGRATED CIRCUITS", which is a continuation of U.S. patent application Ser. No. 13/218,581 filed Aug. 26, 2011 entitled "METHODS AND SYSTEMS FOR COMPUTER AIDED DESIGN OF 3D INTEGRATED CIRCUITS", which is a continuation of U.S. patent application Ser. No. 12/233,260 filed Sep. 18, 2008 entitled "METHODS AND SYSTEMS FOR COMPUTER AIDED DESIGN OF 3D INTEGRATED CIRCUITS", which is a divisional of U.S. patent application Ser. No. 11/485,883 filed Jul. 13, 2006 entitled "METHODS AND SYSTEMS FOR COMPUTER AIDED DESIGN OF 3D INTEGRATED CIRCUITS", which in turn claims priority of U.S. Provisional Application 60/702,364 entitled "METHODS AND SYSTEMS FOR COMPUTER AIDED DESIGN OF 3D INTEGRATED CIRCUITS", filed on Jul. 26, 2005, all of which are incorporated by reference herein in their entirety.

STATEMENT REGARDING FEDERALLY SPONSORED RESEARCH OR DEVELOPMENT

This invention was made partially with U.S. Government support from the Defense Advanced Research Projects Agency under Contract No. DAAH01-03-C-R167. The U.S. Government has certain rights in the invention.

BACKGROUND

Ever since the planar integrated circuit was invented independently by Robert Noyce and Jack Kilby in 1959, designers have sought methods to automate the process of creating the mask artwork necessary for photolithography. Originally circuit designers had to manually create accurate scale drawings of a circuit layout and separate these into mask overlays. By the late 1960's, as described in the document, "Masks Automatically," at the Smithsonian National Museum of American History, Science Service, CD 1967051, E&MP 68.001, computer-aided design (CAD) methods had been developed so that designers could provide a circuit description in a symbolic language to a computer program that would trace the mask layers on a light table. By the mid-1970's as computers had developed to the point where bit-mapped graphics could be rendered in real-time, and as integrated circuit densities increased into the thousands of devices per chip, automated graphical layout programs began to appear that permitted the designer to directly "draw" the circuit artwork on a computer monitor using interactive graphical tools. Some of these programs are described in the papers "An Interactive Graphics System for the Design of Integrated Circuits," presented by Infante, B., et al.; and "ICARUS: An Interactive Integrated Circuit Layout Program," presented by Fairbairn, D. G., et al, at the 15th Conference on Design Automation in June 1978.

By the end of the 1970's, many different fabrication processes, or technologies, had been developed by different manufacturers. The earliest layout tools incorporated functions relevant to a specific fabrication process within the code, which meant that the program needed to be modified when the process changed. It quickly became apparent that technology-independence was a necessary characteristic of any program for integrated circuit layout. At the 20th Conference on Design Automation in 1983, papers by Heilweil, M. F., "Technology Rules—The Other Side of Technology Dependent Code," and Von Ehr, G. J., "Position Paper: Role of Technology Design Rules in Design Automation," discussed the types of information that needed to be stored in an external technology file.

By the mid-1980's almost all integrated circuit layout programs had adopted the method of storing technology-dependent information in an external technology file. Some of these programs are described in "CAD Systems for IC Design," by Daniel et al, published in the IEEE Transactions on Computer-Aided Design of Integrated Circuits and Systems, vol. 1, January 1982, pp. 2-12; "Lyra: A New Approach to Geometric Layout Rule Checking," by Arnold, M. H. et al, presented at the 19th Conference on Design Automation in June 1982; "Magic: A VLSI Layout System," presented by Ousterhout, J. K., at the 21st Conference on Design Automation in June 1984; and in a further paper by Ousterhout, J. K., "The User Interface and Implementation of an IC Layout Editor," published in the IEEE Transactions on Computer-Aided Design of Integrated Circuits and Systems, vol. 3, July 1984.

At the 22nd Conference on Design Automation in 1985, Smith, P. et al, presented a general framework for a canonical technology file structure in the paper, "The VIVID System Approach to Technology Independence: the Master Technology File System". The master technology file contains information concerning the design layers that may be drawn, as well as the graphical stipple patterns and colors for rendering the corresponding shapes on a computer monitor display. It also incorporates electrical and physical design rules to specify electrical connectivity between layers or to enforce constraints such as minimum width or spacing rules. While the exact format and contents of the technology file as implemented today in any given CAD program may vary greatly, this basic structure has become well established.

A second innovation in the development of CAD tools for integrated circuit layout, which has also become a standard feature, is the ability to create hierarchical structures and to implement standard cell libraries. An early example of a CAD system implementing cell hierarchies was presented by Edmondson, T. H., et al, "A Low Cost Hierarchical System for VLSI Layout and Verification," at the 18th Conference on Design Automation in June 1981. In a hierarchical design, "leaf" cells representing simple combinations of gates or interconnect wiring are created as independent structures. A more complex cell can be formed by instantiating combinations of leaf cells in different positions and orientations. Not only is hierarchical design more efficient in terms of memory storage than a "flat" design, but it also permits the use of symbolic notation to represent the leaf cells in a library. This feature further leads to the possibility of automatically generating the layout from schematic or behavioral descriptions with minimal human intervention required to finalize the artwork before fabrication. U.S. Pat. No. 4,612,618 describes a canonical approach for the hierarchical, computerized design of integrated circuits.

More recently, as the need for increased circuit densities and functionalities have begun to outpace the ability of two-dimensional planar fabrication processes to produce these economically, attention has been turning to the possibilities offered by three-dimensional integration. Herein below, the term "three-dimensional integrated circuit", or 3-D IC, refers to a circuit in which active devices layers are stacked on top of one another and electrically interconnected. The distinction is primarily related to the stacking of active devices that are formed in a semiconductor substrate. Current planar processes are inherently "three-dimensional" in that they are composed of devices upon which are formed one or more layers of dielectric and conducting materials. The text, Three-Dimensional Integrated Circuit Layout (Distinguished Dissertations in Computer Science), edited by Harter, A. C., Cambridge University Press, November, 1991, uses the term to describe the multi-layer metallization used in the planar CMOS process, and not a multi-layer device process. Herein below, a three-dimensional integrated circuit is one in which active devices, such as transistors and diodes, may be arranged both vertically and laterally.

The concept of producing three-dimensional integrated circuits to increase device density is not new. U.S. Pat. No. 4,272,880, issued in 1981 describes a method for fabricating multi-layer integrated circuits in a Silicon-on-Sapphire process. U.S. Pat. No. 4,489,478, issued in 1984 describes a method for forming a secondary semiconductor layer on top of a first with an interposing dielectric layer. However, it is only recently that manufacturing economics have spurred a renewed interest both in 3-D technology development and in 3-D circuit design. A plethora of patents have been issued in the last five years on different methodologies and approaches for 3-D integrated circuit fabrication.

U.S. Pat. No. 6,355,501 describes a method for creating 3-D circuits by stacking and aligning Silicon-on-Insulator (SOI) chips with an interposing metal layer to form interconnects. U.S. Pat. No. 6,465,892 describes a method for routing metal interconnect between vertically aligned circuit layers by boring through the substrates. U.S. Pat. No. 6,525,415 describes another method of stacking and aligning semiconductor substrates with embedded interconnect layers. U.S. Pat. No. 6,727,517 describes a vertical integration approach that involves growing semiconductor crystal grains by metal-induced lateral crystallization following patterning of amorphous silicon on deposited metal strips. U.S. Pat. No. 6,875,671 describes an approach utilizing a substrate with layers of predetermined weak and strong bond regions. Deconstructed layers of silicon circuits are fabricated on the weak bond regions and are then peeled off to form multi-layer circuits. U.S. Pat. No. 6,881,994 describes a monolithic fabrication methodology for fabricating a three-dimensional array of charge-storage devices. U.S. Pat. No. 6,943,067 describes yet another SOI-based fabrication approach incorporating a low temperature bonding method and backside/substrate contact process.

Other 3-D fabrication approaches in development have been described in the scientific literature, such as McIlrath, L. G. et al, "Architecture for Low-Power Real-Time Image Analysis using 3D Silicon Technology," Proceedings of SPIE AeroSense 1998, vol. 3362, August 1998; Subramanian, V., et al, "Low-Leakage Germanium-Seeded Laterally-Crystallized Single-Grain 100-nm TFT's for Vertical Integration Applications," IEEE Electron Device Letters, vol. 20, no. 7, July 1999; Banerjee, K., et al, "3-D ICs: A Novel Chip Design for Improving DeepSubmicrometer Interconnect Performance and Systems-on-Chip Integration," Proceedings of the IEEE, vol. 89, no. 5, May 2001; Burns, J. A., et al, "Three-Dimensional Integrated Circuits for Low-Power, High Bandwidth Systems on a Chip," Proceedings of the 2001 IEEE International Solid State Circuits Conference, February 2001; and Patti, R., "3D: Design to Volume—A Look at Various 3D Applications, Their Designs, and Ultimate Silicon Results," 3D Architectures for Semiconductor Integration and Packaging Symposium, June 2005.

Because technologies for fabricating 3-D integrated circuits have not yet become firmly established, relatively few designers have had the opportunity to develop 3-D circuits for fabrication. For the most part, the designers that have needed to create mask artwork for 3-D circuits have done so by implementing ad hoc workarounds within conventional CAD programs for 2-D layout. One possible workaround is to manually align cells for different stack levels by creating pseudo-3D cells, that is, having leaf cells that are the circuits for each layer. This method does not allow design rule checks or netlist extraction, however. Another method is to replicate the design layer names contained in the 2-D technology file for each of the levels in the stack. This method requires that special rules be created to specify inter-level interconnects. It also results in multiple replications of the electrical and physical design rules for each design layer and is very inefficient in terms of memory usage. The text, Three-Dimensional Integrated Circuit Layout (Distinguished Dissertations in Computer Science), by Harter, A. C., Cambridge University Press, November, 1991, describes some primitive methods for creating topologies for wiring standard cells on multiple layers, but does not provide direct methods for efficiently creating the mask artwork.

Several examples of fabricated 3-D circuits have been described in the literature. Koyanagi, M., et al, "Neuromorphic vision chip fabricated using three-dimensional integration technology," Proceedings of the 2001 IEEE International Solid State Circuits Conference, February 2001, describes a 3-D IC containing a photoreceptor layer and two neuromorphic layers that perform operations similar to retinal bipolar and ganglion cells.

In the previously cited reference, Burns, J. A., et al, "Three-Dimensional Integrated Circuits for Low-Power, High Bandwidth Systems on a Chip," a 3-D IC is described that has a photodiode on one layer coupled to an analog-to-digital (AID) conversion circuit on a second layer. U.S. Pat. No. 6,741,198 describes a generalized architecture for a three-layer digital imaging chip incorporating a photosensor, an A/D converter, and a digital signal processing circuit, all realized on separate circuit layers.

A 3-D radio frequency (RF) transceiver was presented by Qun, G., et al, "Three-dimensional circuit integration based on self-synchronized RF-interconnect using capacitive coupling," 2004 Symposium on VLSI Technology, June 2004. In this device the vertical interconnects are realized through capacitive coupling of elements on separate layers. In Koob, J. C., et al, "Design of a 3D Fully-Depleted SOI Computational RAM," IEEE Transactions on Very Large Scale Integration Systems, vol. 13, no. 3, March 2005, a design is presented for a modular 3-D integrated processor-in-memory stack. The key feature of this design is that the same photolithography masks for each circuit level can be re-used. A hierarchical bus evaluation network senses how many layers are in the stack and generates addresses accordingly. Patti, R., "3D: Design to Volume—A Look at Various 3D Applications, Their Designs, and Ultimate Silicon Results," 3D Architectures for Semiconductor Integration and Packaging Symposium, June 2005, describes another 3-D processor-in-memory device in which the memory elements are embedded in a circuit below the processor units.

The primary feature that is common to all of these designs is that the cell structures requiring 3-D interconnections are relatively simple. In the 3-D imaging chips, a single inter-layer interconnect is used to connect the photoreceptor to the active pixel circuit on the layer below, and only one or two 3-D interconnects are required to connect the active pixel circuit to the processing layer below it. In the 3-D integrated RF circuit, physical interconnection structures are not required. The processor-in-memory 3-D circuits are each composed of arrays of identical processing elements. Only the unit 3-D cells for each element needed to be laid out carefully and manually checked. Because of this simplicity, it was feasible, albeit time consuming, for the designers to create the mask artwork for the individual circuit layers by ad hoc methods with standard 2-D layout CAD tools.

It should be clear from this discussion that better, more automated CAD systems and methods are required for 3-D IC design before complex components can be realized. Many researchers are now investigating 3-D topologies at a higher level of abstraction than the physical layout. Routing methods for 3-D field programmable gate arrays (FPGAs) are analyzed by Hung, W. N. N., et al, "Routability checking for three-dimensional architectures," IEEE Transactions on Very Large Scale Integration Systems, Vol. 12, No. 12, December 2004; and Manimegalai, R., "Placement and routing for 3D-FPGAs using reinforcement learning and support vector machines," 18th International Conference on VLSI Design, 2005. In order to reduce these systems to practice, automated tools for artwork creation and verification will have to be put in place.

In the paper by McIlrath, L. G., "High Performance, Low Power Three-Dimensional Integrated Circuits for Next Generation Technologies," Proceedings 2002 International Conference on Solid State Devices and Materials, Nagoya, Japan, September 2002, the requirements of an automated 3-D CAD program for generating multi-layer layouts were specified. These requirements include the need to incorporate multiple technology files for combining the technology-dependent information for different processes and the need to implement a hierarchical 3-D cell structure that can handle both vertical and lateral dependencies.

SUMMARY

In one embodiment, a 3-D technology file of these teachings is obtained by providing an identifier for two or more circuit levels, providing for each one of the two or more circuit levels identifier for a 2-D technology file corresponding to each of the one are more circuit levels and providing a file structure including the two or more circuit levels and each identifier, corresponding to each one of the to a more circuit levels, for the 2-D technology file corresponding to each one of the two or more circuit fails.

In another, embodiment, a 3-D cell structure of these teachings is a 3-D cell data structure including a root data structure having a root node data object, the root node data object identifying a 3-D structure and a number of branch reference data objects.

For a better understanding of the present teachings, together with other and further needs thereof, reference is made to the accompanying drawings and detailed description and its scope will be pointed out in the appended claims.

BRIEF DESCRIPTION OF THE DRAWINGS

FIG. 17a illustrates a prototype for one embodiment of a user interface menu to create a new layout cell in one embodiment of an automated design program for 3-D integrated circuit;

FIG. 17b illustrates a prototype for one embodiment of a user interface menu to select the drawing level for a 3-D layout cell in one embodiment of an automated design program for 3-D integrated circuit; and FIG. 17c illustrates a prototype for one embodiment of a user interface menu to instantiate a 2-D child cell within a 3-D hierarchical cell, or to instantiate a 2-D child cell representing the circuit level projection of a 3-D cell within a 2-D hierarchical cell, in one embodiment of an automated design program for 3-D integrated circuit.

DETAILED DESCRIPTION

Figure 1:
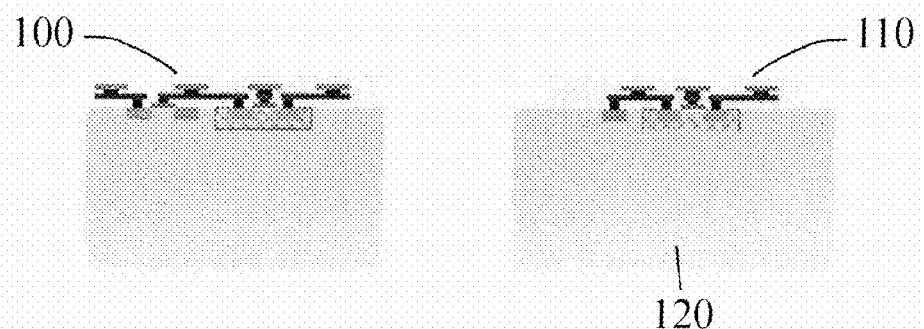
FIG. 1 illustrates one method of creating a 2-layer 3-D integrated circuit from two separately fabricated semiconductor dice according to prior art.
Figure 1:
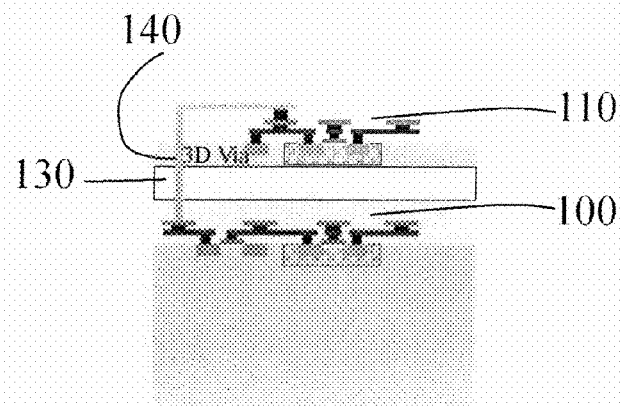

Methods and systems for generating and verifying circuit layouts from computer-aided design tools for vertically integrated, three-dimensional integrated circuits are disclosed herein below.

A three-dimensional, or 3-D, integrated circuit is one comprising multiple levels of semiconductor substrates, each containing active devices therein, in which the different substrates are vertically stacked and electrical interconnections may be made between circuit components on different levels. A significant innovation of emerging 3-D integration technology is that the vertical interconnections may be placed anywhere within the area of any circuit level. This feature provides for a tremendous improvement in device density, but it also adds new constraints for the designer, who should ensure that appropriate design rules are met and that the 3-D physical circuit will function according to the specifications of the logic design.

The ability to provide arbitrarily placed vertical interconnections means that basic functional blocks may be composed from 3-dimensional unit cells in a design library. A computer-aided design program should be able to efficiently place such cells in an overall chip layout along with 2-D cells assigned to a given circuit level and ensure that all physical and electrical design rules are met.

Embodiments of the methods of the present invention permit the implementation within an integrated circuit layout program of all functions necessary to design the mask artwork for a 3-D integrated circuit. The embodiments disclosed include a new hierarchical structure for a 3-D technology file that describes to the CAD program the essential aspects of the 3-D integration process. The hierarchical 3-D technology file assigns a 2-D technology to each circuit layer and permits indexing the 2-D technology-dependent information relative to the circuit layer, so that there is no need to duplicate this information. This structure permits existing 2-D technology files, whether created by the user or supplied in a foundry design kit, to be used without modification in the 3-D layout design program.

Embodiments of the data structure of this invention include a data structure for a 3-D hierarchical layout cell that permits inclusion of mask artwork for 3-D design layers as well as for 2-D design layers on specific levels at the top level of the hierarchy. Within the 3-D hierarchical cell, both 3-D and 2-D child sub-cells may be instantiated, the latter after specifying the circuit level to which they are assigned. Substantially no information regarding the level assignment is maintained internally within a 2-D cell until it is instantiated into a 3-D parent. In this manner standard cell libraries containing basic logic cells for 2-D design may be used without modification. Furthermore the morphology of the 3-D integrated circuit may be modified, either by adding circuit levels or by changing the stacking order of the circuit levels, without modification to the basic library.

A feature of the embodiment of the 3-D hierarchical tree organization disclosed below is a method to access a 3-D hierarchical cell by reference to its projection onto a single circuit level. In this manner a 2-D cell may instantiate a 3-D circuit level projection as a child sub-cell without creating a cycle in the tree structure. It is noted that once such a projection is instantiated within a 2-D cell, the cell does contain information related to a given circuit level and thereafter cannot be instantiated as a child of a 3-D parent at a different level.

Methods and systems to exercise the data structures created by insertion of the data structure embodiments into prior art CAD programs for integrated circuit layout can be readily incorporated by adding or modifying user interfaces to provide additional information on circuit level placement. It should be noted that existing prior art verification methods for design rule checking (DRC) and layout vs. schematic (LVS) comparison may be readily adapted to accommodate the 3-D data structures described by incorporating appropriate methods to reference the fields included therein.

Referring to FIG. 1, there is diagrammatically illustrated one manner of assembling a 3D integrated circuit from two individually fabricated wafers. On one wafer is patterned a first circuit (100), and on the other wafer is patterned a second circuit (110). The substrate (120) of the second circuit is thinned to a minimal thickness and the second circuit is then overlaid and bonded to the first circuit by means of an intervening bonding material (130). Subsequently, an opening is etched through the upper circuit layer and filled with metal to electrically connect the circuits (100) and (110), forming a 3-D via (140). To establish the terminology that will be employed in the description, the term "circuit level" will be used to refer to a planar arrangement of devices formed in the same semiconductor substrate, and the term "bond layer" will be used to refer to all materials, whether explicitly drawn in the layout or not, added between the circuit levels during the 3-D stacking process. A "3-D via" is any structure or combination of materials that creates an electrical connection between materials on different circuit levels. This terminology will be employed whether the 3-D integration process involves the steps depicted in FIG. 1, or if it involves monolithic growth of multiple vertically arranged substrates, or if it uses any of the previously enumerated 3-D fabrication methods.

Figure 2:
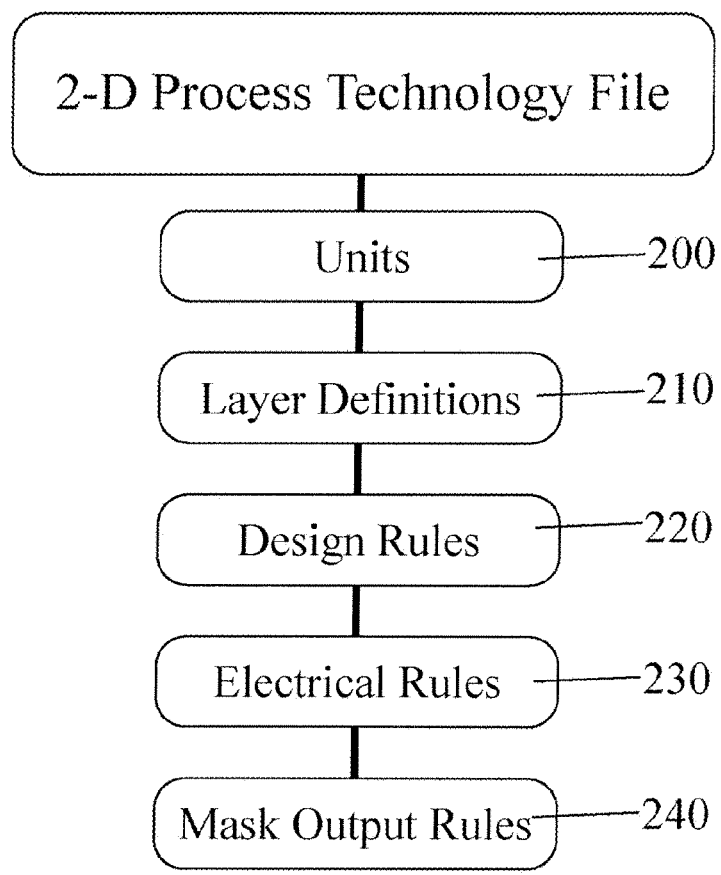
FIG. 2 is a block diagram outlining the components of a technology file as used by CAD programs for 2-D integrated circuit design according to prior art.

A conventional 2-D technology file will contain certain technology-dependent information that describes to a CAD program rules and methods for generating and validating a circuit layout for the given process. The primary elements of a conventional 2-D technology file are diagrammatically depicted in FIG. 2.

The Units Section (200) defines the units of measure on the layout grid, for example, micrometers or mils ($1/1000$'h inch), and also the minimum grid resolution with which geometric shapes may be drawn. The minimum grid resolution is determined by the minimum resolvable feature size of the fabrication process. Drawing shapes smaller than this limit not only has no purpose, because the shapes cannot be reproduced on the fabricated circuit, but also increases the amount of off-line memory required for storing the mask data.

The Layer Definitions Section (210) describes the abstract design types that may be drawn.

The Design Rules Section (220) provides a set of geometric rules that should be followed by the designer in order to ensure proper functioning of the circuit. These rules are imposed by the foundry and specify constraints on the drawn shapes such as minimum allowed widths and spacing between geometry of the same or different layers.

The Electrical Rules Section (230) describes how the design layers interact electrically and combine to form devices. These rules are necessary in order to extract an electrical netlist from the layout and verify that it corresponds to its schematic description.

The Mask Output Rules Section (240) specifies how to map shapes drawn as abstract design layers to shapes on physical mask layers.

A 2-D technology file will always contain a Layers Definition Section, although it need not contain information in any of the other sections, and it may contain sections not listed above.

Figure 3:
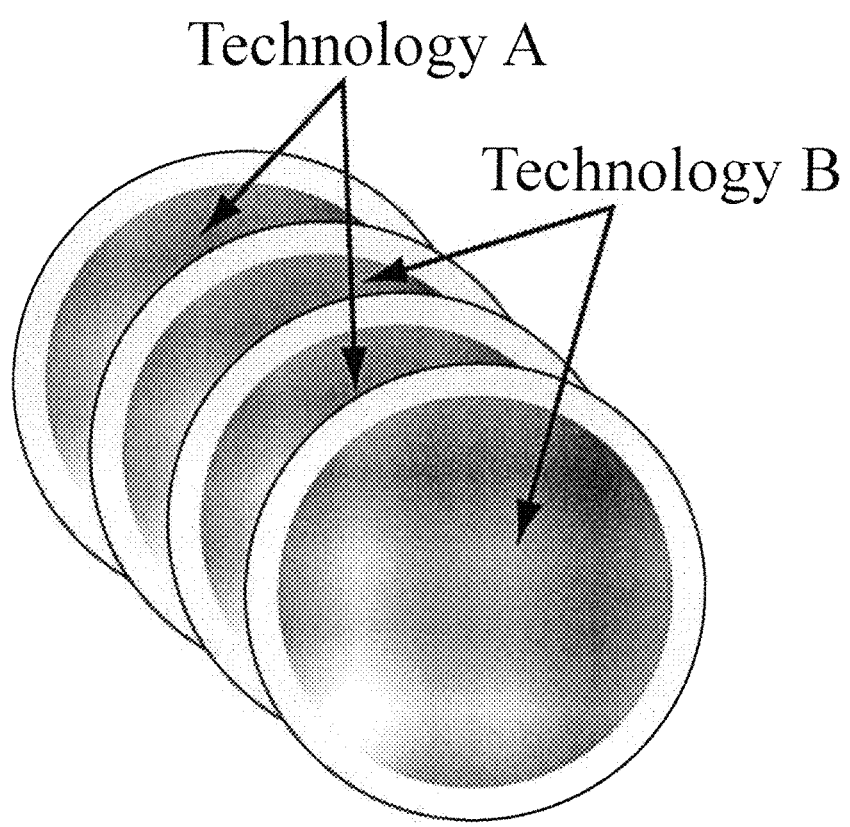
FIG. 3 depicts multiple wafers fabricated with different process technologies to be assembled into a 3-D integrated circuit.

For 3-D integrated circuit design, a 3-D technology file should contain information on how the vertically integrated device is to be assembled, as well as information on the fabrication processes for the individual circuit levels. The wafers comprising the circuit levels in the stack may all be fabricated in the same 2-D process, or they may each be fabricated in a different process and have different material substrates. FIG. 3 provides an illustration of a set of four wafers to be diced and assembled into a 3-D circuit, in which two wafers are fabricated using a technology A and the other two fabricated using a technology B.

Figure 4:
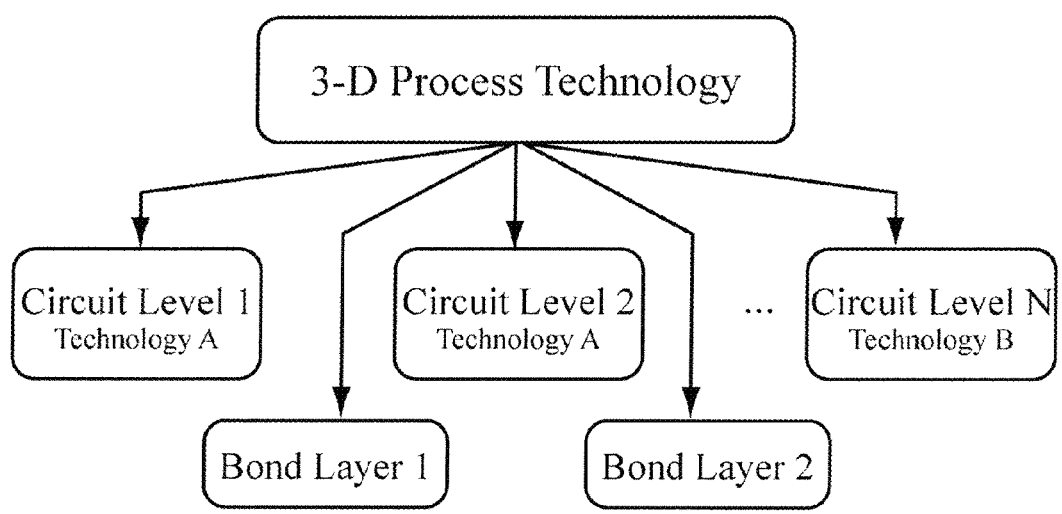
FIG. 4 is a block diagram illustrating the components of a 3-D integrated circuit composed of N circuit levels.

The embodiment of the 3-D technology file structure disclosed below does not depend on how many 2-D sub-technologies are present. It also does not depend on any specific 3-D process methodology, whether based on monolithic recrystallization, or on stacking and bonding circuits from independently fabricated wafers. For any process, the structure of a 3-D integrated circuit can be described by the depiction of FIG. 4 as a sequence of circuit levels separated by bond layers. In some 3-D integration processes, the intervening bond layers may be absent or implicit if no new material is added to join the circuit levels in the 3-D stack. The details of how the circuit levels and bond layers are formed are embodied within the corresponding sections of the 3-D technology file.

Figure 5:
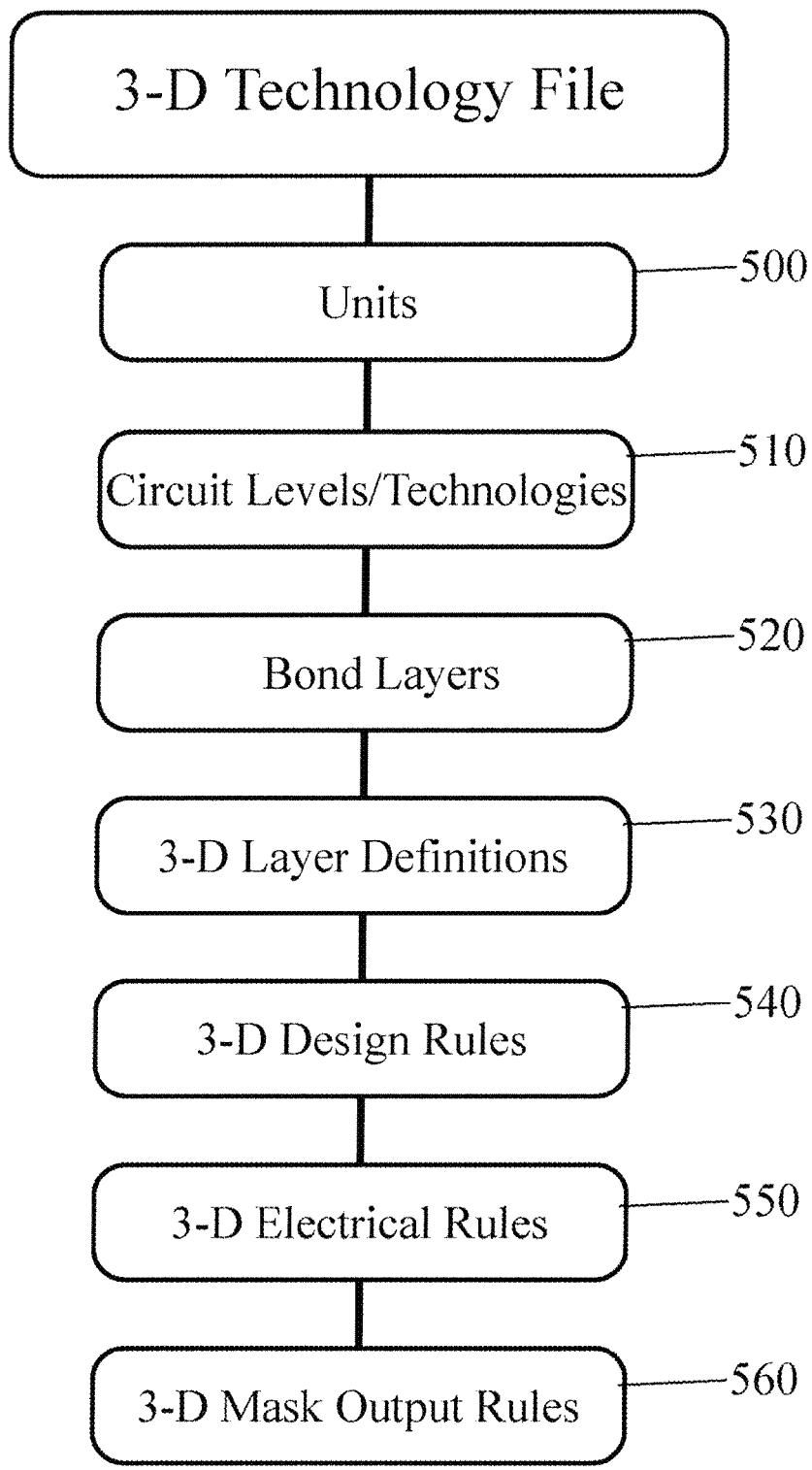
FIG. 5 is a block diagram outlining the major sections of an embodiment of a 3-D technology file according to these teachings.

Referring to FIG. 5, there is diagrammatically illustrated the principal elements comprising an embodiment of a 3-D technology file structure of these teachings. A specific 3-D technology file need not contain information in all of the sections depicted, and it may contain sections not shown in the diagram, however it should contain a Circuit Levels/Technologies Section (510).

The Units Section (500) plays a similar role in the 3-D technology file as it does in the 2D technology file. It should be recognized that there is no requirement that all circuit levels comprising the 3-D integrated circuit have the same minimum feature sizes. For example, micro-electro-mechanical (MEMS) circuit with a 2 micrometer minimum feature size might be joined to a CMOS circuit with a 90 nanometer minimum feature size. The Units Section in the 3-D technology file should specify the units and resolution at which geometry is drawn for the 3-D integration process.

Figure 6A:
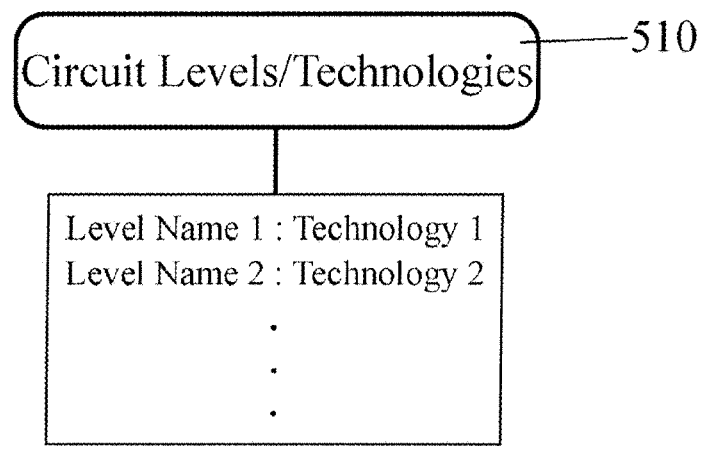
FIG. 6a is a block diagram illustrating the components of the Circuit Levels/Technologies Section in one embodiment of a 3-D technology file according to these teachings.

The Circuit Levels/Technologies Section (510) defines each circuit level and specifies the 2-D technology with which it is fabricated. FIG. 6a illustrates diagrammatically the contents of this section in one embodiment. Each circuit level is assigned a name and is associated with the name of a 2-D technology file. This name will be used to index the materials for each level. In a preferred embodiment of a CAD program utilizing the 3-D technology file, the names of each level would be stored in a list along with a pointer to a data structure containing the elements of the relevant 2-D technology file. This will enable each 2-D sub-technology to be loaded only once into the main memory of a computer for an automated design program and to be indexed by the circuit level identifier.

Figure 6B:
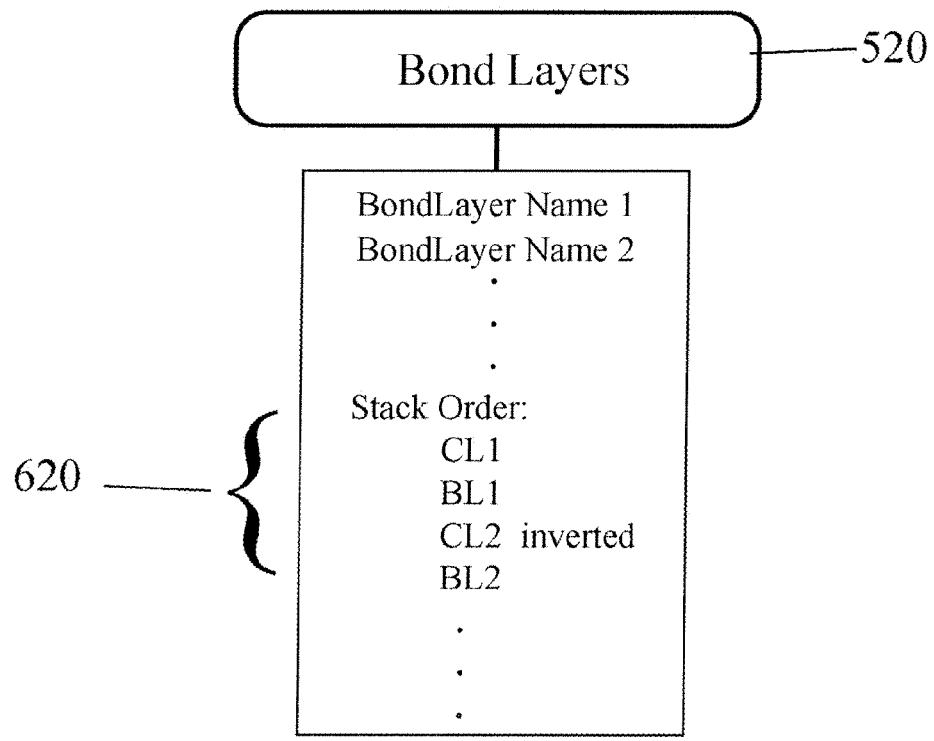
FIG. 6b is a block diagram illustrating the components of the Bond Layers Section in one embodiment of a 3-D technology file according to these teachings.

The Bond Layers Section (520) defines a structure containing the material layers that are formed between two circuit levels during the 3-D assembly process. A bond layer need not be defined if the 3-D process does not require one—for example, if the stack is formed by thermal compression of two circuit levels and no additional materials are added. If, however, additional processing requires deposition of an oxide layer or additional metallization, the bond layer should be defined to identify the geometries drawn for these features. FIG. 6b illustrates diagrammatically the contents of this section in a preferred embodiment. Each of the bond layers is defined and given a name. As with the circuit level definitions, the bond layer identifier will serve as an index to distinguish the set of materials within the layer. In a preferred embodiment the ordering of the circuit levels and bond layers follows the definition of both. A 'Stack Order" instruction (620) lists the circuit levels and bond layers by their identifiers in the order in which they appear in the 3-D integrated circuit. It also provides the opportunity to indicate whether the circuit level is inverted before being placed on the stack. Other information may be added as well, including thicknesses of the bonding material. This information is useful in extracting solid models of the 3-D circuit from the layout data. In other embodiments the stack order instruction may appear in a different section of the technology file.

Figure 6C:
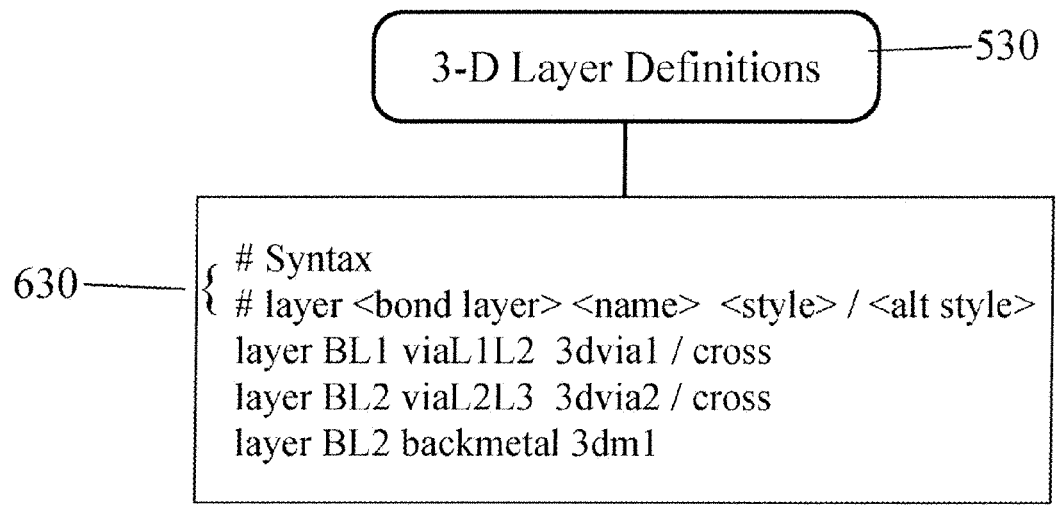
FIG. 6c is a block diagram illustrating the components of the 3-D Layer Definitions Section in one embodiment of a 3-D technology file according to these teachings.

The 3-D Layer Definition Section (530) is required if geometry is drawn for materials added or formed during the 3-D assembly process and not during the fabrication of the circuit levels. FIG. 6c illustrates diagrammatically some statements present in this section for one embodiment of a 3-D technology file. The syntax (630), indicated in comments above the statements defining the layers, is similar to that which might be found in a 2-D technology file. The name of the layer is given along with the names of a set of style patterns with which the layer will be rendered on a computer monitor. In addition, for the 3-D technology file, the bond layer in which the material layer is formed is identified to associate the material with a particular physical location in the 3-D integrated circuit.

Figure 6D:
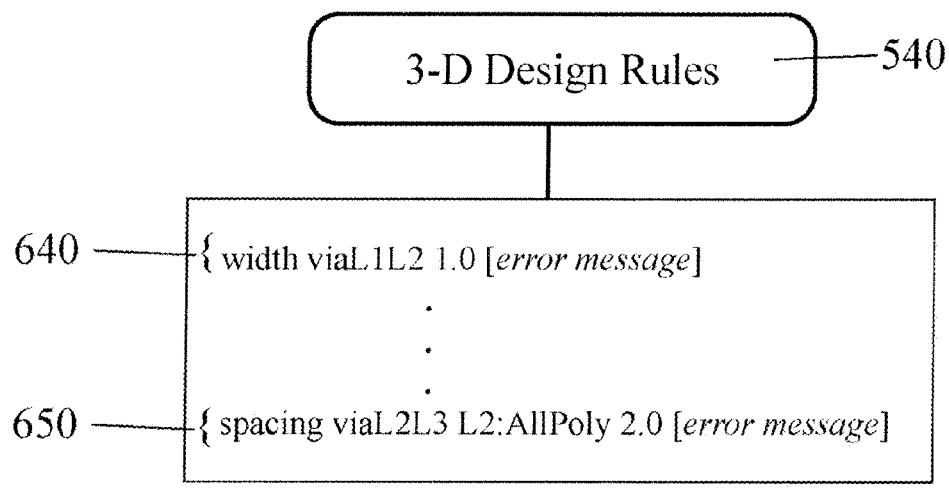
FIG. 6d is a block diagram illustrating the components of the 3-D Design Rules Section in one embodiment of a 3-D technology file according to these teachings.

The 3-D Design Rules Section (540) provides a set of rules specific to the 3-D assembly process that concern the 3-D layers and any requirements for vertical alignment of circuits on different levels. FIG. 6d illustrates diagrammatically some statements present in this section for one embodiment of a 3-D technology file. The width rule (640) defines the minimum width, in the units defined in the Units Section, for the named 3-D material layer, previously defined in the 3-D Layer Definition Section. The spacing rule (650) defines the minimum spacing between a 3-D material layer and a group of layers found on the circuit level identified by 'L2'. The 2-D material layers thus designated will have been defined in the 2-D technology data structure pointed to by the circuit level identifier. In drawing geometry for a 3-D cell, an error will be raised if a shape of the named 3-D material layer is drawn within the minimum spacing to the 2-D materials on the named level, but not on any other level, unless rules are added for these other levels. The 3-D Design Rules Section may contain rules for geometric constraints other than width and spacing, and these may concern any combination of 3-D material layers and 2-D materials on different levels.

Figure 6E:
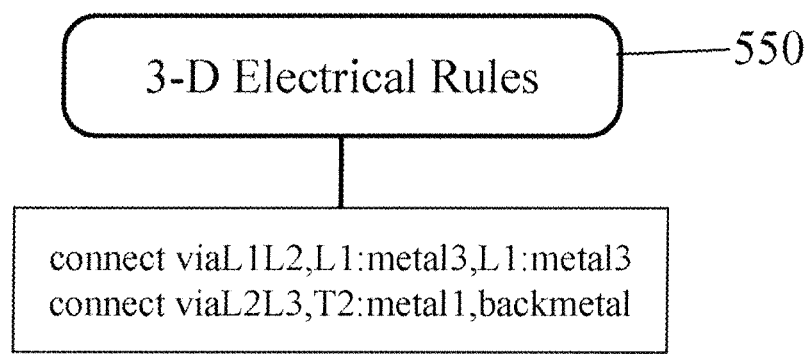
FIG. 6e is a block diagram illustrating the components of the 3-D Electrical Rules Section in one embodiment of a 3-D technology file according to these teachings.

The 3-D Electrical Rules Section (550) defines the interconnect methodology for connecting different circuit levels. This section may define the connectivity of 3-D vias, or it may define connectivity between materials on individual circuit levels defined in the 2-D technology that connect when the levels are stacked and joined together. FIG. 6e illustrates diagrammatically some statements present in this section for one embodiment of a 3-D technology file. The statements illustrated specify that the shapes of the named layers in the list will connect electrically when they touch or overlap. The layers may be defined either in the 3-D technology file or in one of the 2-D sub-technologies. In the latter case, the circuit level identifier should be present with the layer name. Any other types of statements usually appearing in the Electrical Rules Section of a 2-D technology file may also appear in this section for the 3-D technology file.

The 3-D Mask Output Rules Section (560) specifies how to map shapes drawn on the 3-D design layers to shapes on physical mask layers. The mapping rules will be similar to those found in the Mask Output Rules Section of any 2-D technology file.

Figure 6F:
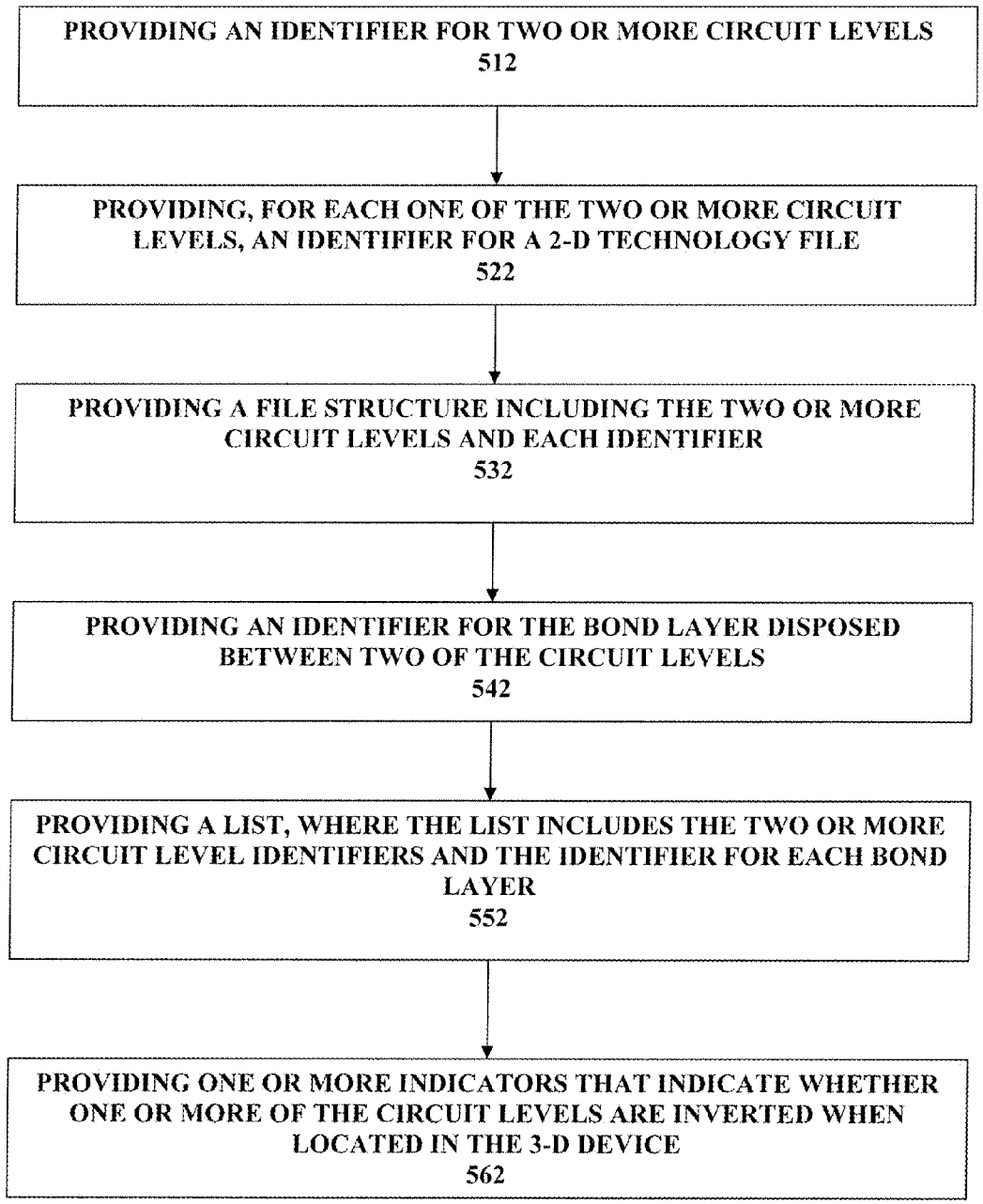
FIG. 6f is a flowchart representation of an embodiment of the method of these teachings for obtaining a 3-D technology file.

In one embodiment, shown in FIG. 6f, the 3-D technology file of these teachings is obtained by providing 512 an identifier for two or more circuit levels, providing 522, for each one of the two or more circuit levels, an identifier for a 2-D technology file corresponding to each of the one are more circuit levels and providing 532 a file structure including the two or more circuit levels and each identifier, corresponding to each one of the to a more circuit levels, for the 2-D technology file corresponding to each one of the two or more circuit fails. In one instance, the identifier for each 2-D technology file is a pointer to the 2-D technology file. In another embodiment, the method of obtaining the 3-D technology file of these teachings also includes providing 542 an identifier for the bond layer disposed between two of the circuit levels. In another instance, a list is provided 552, where the list includes the two or more circuit level identifiers and the identifier for each bond layer, the identifiers being listed in the order in which the corresponding structures appear in the 3-D integrated circuit. In another instance, one or more indicators are provided 562 where the one or more indicators indicate whether one or more of the circuit levels are inverted when located in the 3-D device. In other instances, design layer identifying information is provided for layers formed in assembly of the 3-D device, or rules are provided for 3-D assembly, or physical design rules are provided for 3-D device integration or rules are provided for generating physical masks for 3-D device fabrication.

Figure 6G:
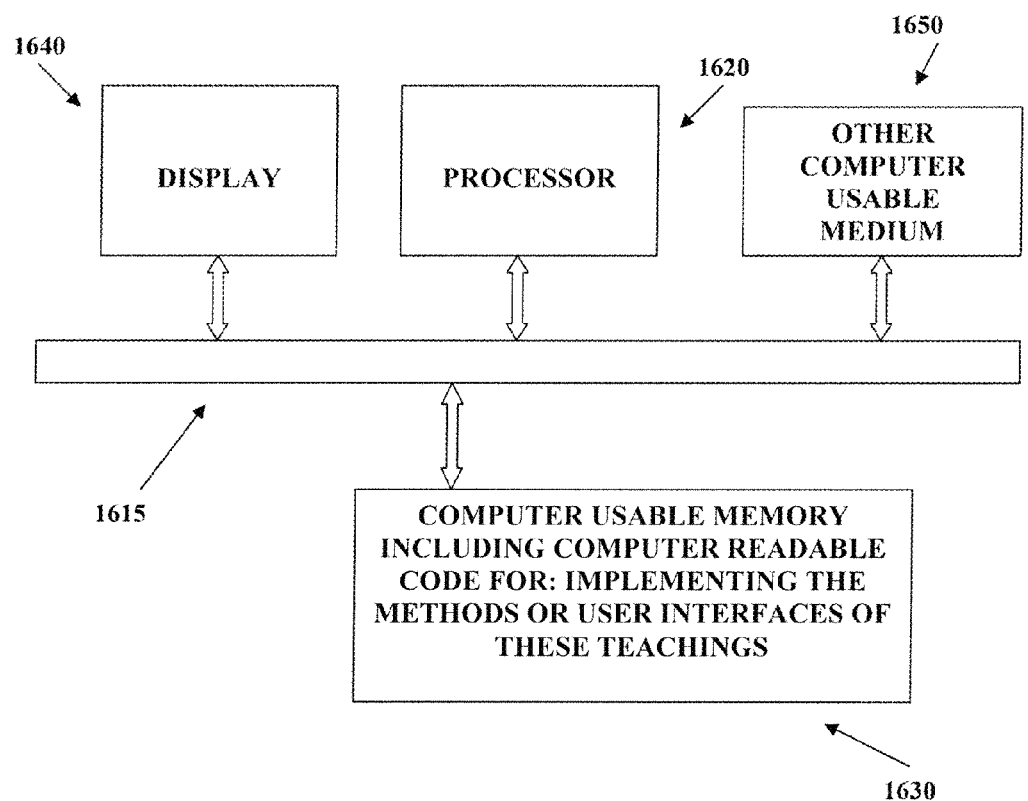
FIG. 6g is a block diagram of an embodiment of a system for implementing the methods and data structures according to these teachings.

It should also be noted that the 3-D technology file of these teachings can be obtained by use of a system, such as that shown in FIG. 6g, including one or more processors 1620, a computer usable medium 1650 including a data structure, where the data structure includes the above described file structure, and another computer usable medium 1630 (which could be the same as the first computer usable medium) having a computer readable code embodied therein that causes the one or more processors to input the data structure and input each 2-D technology file corresponding to each one of the circuit levels. In one instance, each of the 2-D technology files is inputted only once. In another instance, the system also includes a display 1640. The one or more processors 1620, the computer usable medium 1650, the other computer usable medium 1630 and the display 1640 are operatively connected by connection means 1615, such as a computer bus in one embodiment or carrier signals in another embodiment.

There are multiple advantages to defining a 3-D technology file in the hierarchical manner shown, as opposed to extending existing 2-D technology files by replicating layers and rules. In summary, the disclosed 3-D technology file structure permits:

In order to design a 3-D integrated circuit using current art methods incorporating a 2-D technology file as described above, a set of unique material layer names for each circuit level should be defined. For example, a technology file for a 3-D integration process comprising three levels, all fabricated in the same CMOS process, would need to have layers polysilicon_1, polysilicon_2, and polysilicon_3; active_1, active_2, and active_3, etc., in order to differentiate artwork on level 1, 2, and 3. The CAD layout program using this file should understand that polysilicon_2 interacts with active_2 and not activem1 to form a transistor. In addition, the 2-D design and electrical rules pertaining to each material layer should also be replicated, even though they are identical except for the suffix on the layer name. On the other hand, 3-D vias, and also 3-D design rules, should be defined between the correct drawing layers on the corresponding levels. Whether the multi-layer technology file is created by hand or automatically generated from the 2-D technology using software methods, the increased number of layers requires more administrative maintenance and is susceptible to errors introduced in the process.

In the hierarchical structure of the 3-D technology file, only one data structure is created for each 2-D technology file and loaded into the computer's main memory, regardless of how many times it is used on different circuit levels. Furthermore, the data structures can be more efficiently organized in a hierarchical manner than in a flattened, or linear, manner, resulting in faster access times to retrieve information.

Foundries that offer 2-D wafer fabrication usually furnish design kits to their users that include technology files and design libraries in the formats used by common CAD software for integrated circuit design. For 3-D integration processes that assemble wafers fabricated in existing foundries, a 3-D technology file can be created without any modification to the 2-D files supplied by the foundry.

Because the material layers are not defined in reference to the circuit level on which they are drawn, previously defined 2-D layouts from design libraries may be instantiated without modification on any circuit level fabricated with the appropriate technology.

There is no restriction on the number or types of different 2-D processes that may be used to fabricate the circuit levels, or on the number of times the same process is used. It is possible to define a 3-D process in which each circuit level is fabricated not only with a different technology, but with different semiconductor materials such as Silicon, Gallium Arsenide, or Silicon-Germanium.

Figure 7:
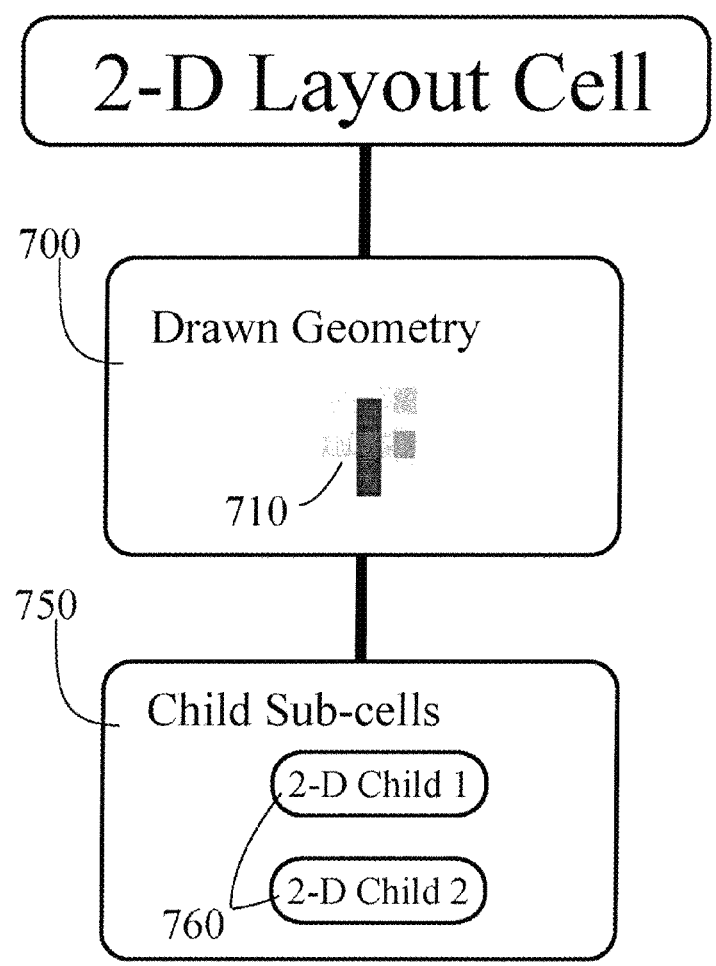
FIG. 7 is a block diagram illustrating the components of a hierarchical 2-D layout cell according to prior art.

Referring to FIG. 7, there is diagrammatically illustrated the general structure of a conventional 2-D hierarchical layout cell. The hierarchical structure is composed of two parts: Drawn Geometry (700) and Child Sub-cells (750). The Drawn Geometry portion (710) may contain any number of shapes, including none, of material layers. The Child Sub-cells portion (760) may contain any number, including none, of instances of 2-D hierarchical cells, also having components of drawn geometry and their own child sub-cells. A cell containing no child sub-cells is referred to as a "leaf" cell. The depth of a child cell in a hierarchy refers to the number of parent cells in its lineage to the top of the hierarchy. The child sub-cells (760) in FIG. 7 are at depth 1. Their direct children, if any, are at depth 2 for this hierarchy, and so on.

Figure 8:
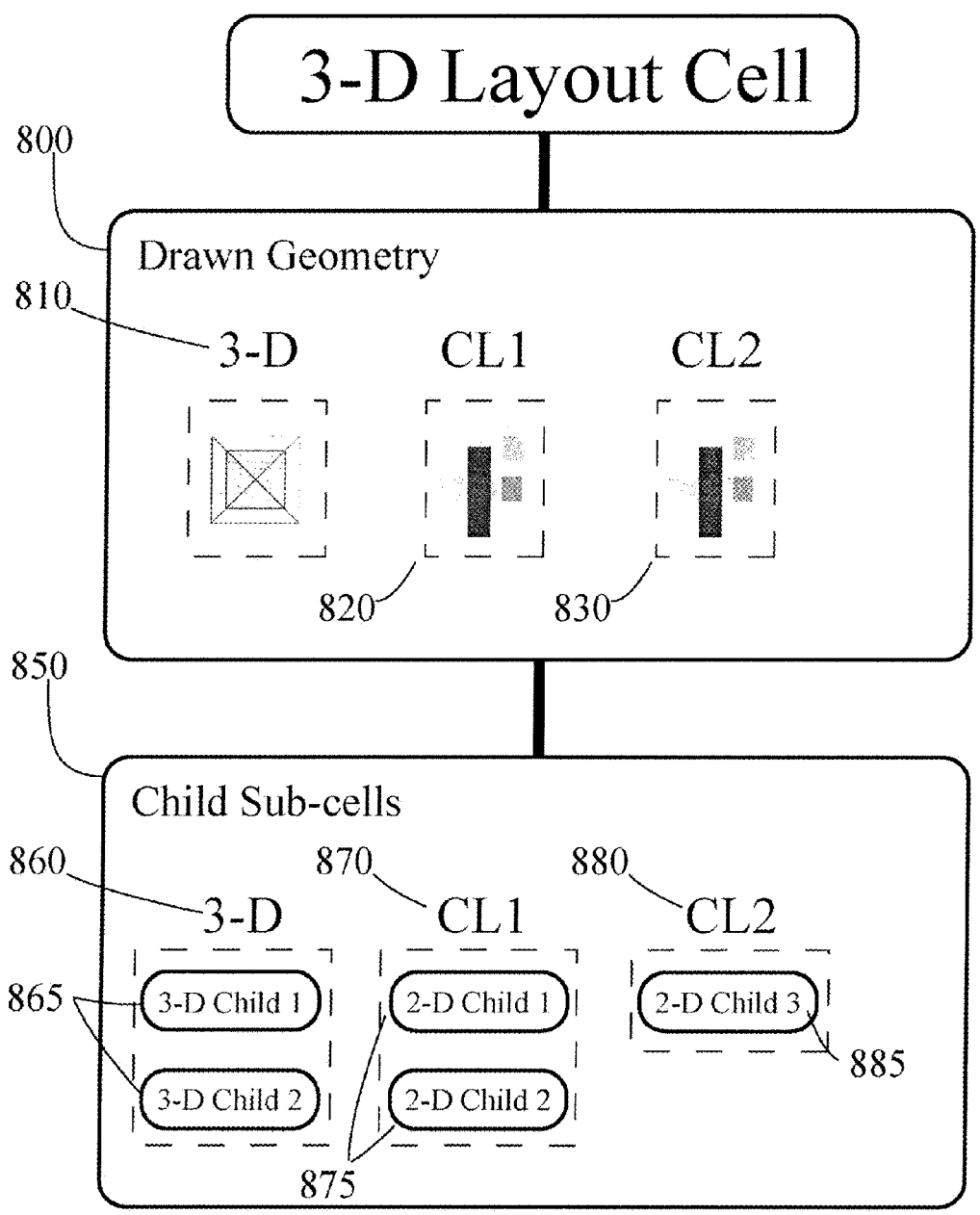
FIG. 8 is a block diagram illustrating the components of a hierarchical 3-D layout cell according to these teachings.

Referring to FIG. 8, there is diagrammatically illustrated an embodiment of a 3-D hierarchical cell according to the present invention. As with the prior art 2-D hierarchical structure, the 3-D hierarchical cell is also partitioned into Drawn Geometry (800) and Child Sub-cells (850) portions. Unlike the 2-D cell, the 3-D cell may contain geometry for 3-D design layers and for 2-D design layers on each of its circuit levels. To simplify the illustration, the 3-D structure shown in FIG. 8 has two circuit levels, CL1 and CL2, however it should be clear from the discussion that the structure described can be extended to having any number of circuit levels.

Figure 9:
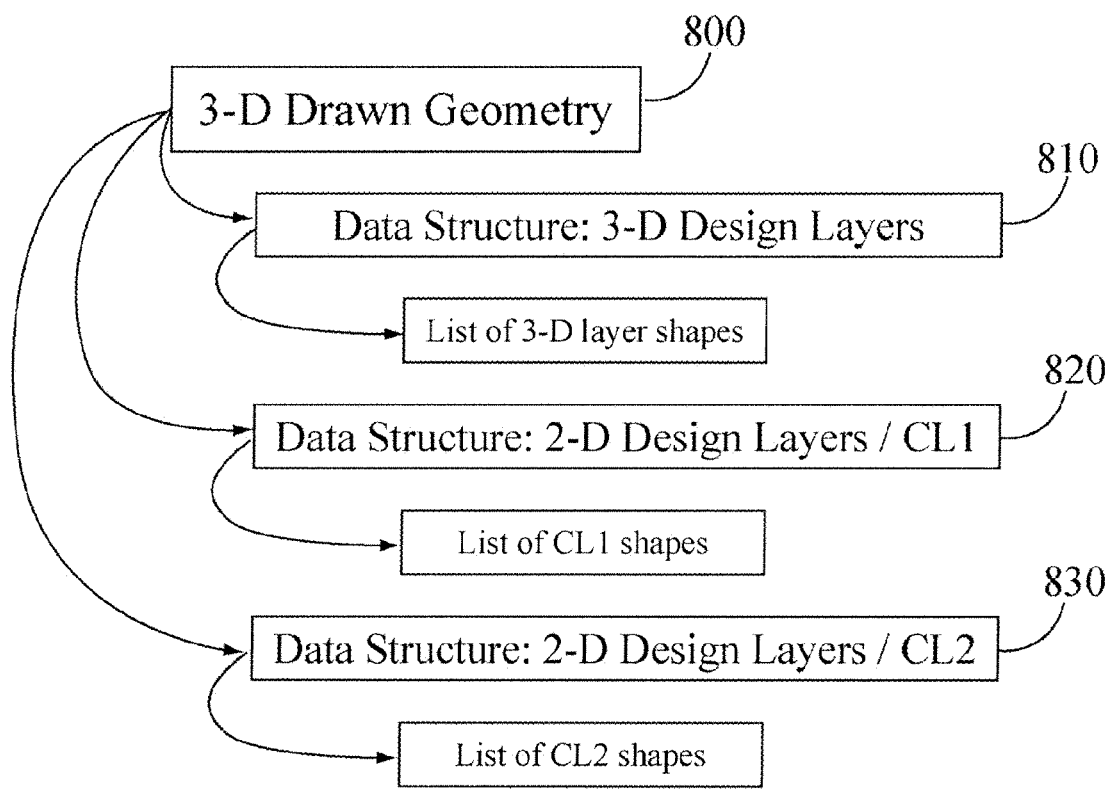
FIG. 9 is a block diagram illustrating one embodiment of the Drawn Geometry data structure for a 3-D layout cell.

In order to avoid excessive numbers of indices associated with each material shape in the 3-D layout cell, it is preferable to implement the Drawn Geometry segment as a data structure in which a root element points to substructures for each circuit level, each of which in turn points to its own data structure containing the material geometry. FIG. 9 illustrates diagrammatically one embodiment of such a data structure. The root element (800) points to elements (810), (820) and (830), each of which is a data structure containing a list of geometric shapes. The structure of the list of shapes may be that of a linked list, a bin-based array, a set of corner-stitched planes, or any of a variety of data structures well known to those skilled in the art of algorithmic design for automated integrated circuit layout.

It is noted that, whereas each circuit level is assigned its own data structure, only one data structure is defined for 3-D material layers. In one embodiment, the 3-D materials are grouped into one structure although they may be on different bond layers. This is done for simplicity because the 3-D technology file provides all information to uniquely identify each 3-D material layer. It can readily be envisioned, however, an application in which it is desirable to implement the material shapes for each bond layer in a separate data structure. The embodiments disclosed herein should not be construed as limiting this possibility.

In the Child Sub-cells (850) segment of FIG. 8, the child sub-cells in the 3-D hierarchical structure are also distinguished as being 3-D (860) or 2-D children, the latter being grouped by circuit level (870) and (880). The number of child cells shown in the diagram in each group is for illustrative purposes only, and does not imply a limit on the number of child sub-cells of any type that may be included in the implementation of any 3-D hierarchical cell. The 3-D child cells (865) are also organized according to the general 3-D hierarchical structure depicted in FIG. 8. In one embodiment, each child sub-cell instance will contain a pointer to a data structure identifying the circuit level to which it is assigned. In another embodiment, the 3-D Child Sub-cells (850) segment may be organized in a similar fashion to the method depicted in FIG. 9 for the 3-D Drawn Geometry segment. In such an embodiment, a root data structure would contain a data structure pointing to a list of 3-D children and a data structure for each of the 2-D circuit levels pointing to a list of 2-D children for the given level.

In one embodiment, the 3-D cell structure of these teachings is a 3-D cell data structure including a root data structure having a root node data object, the root node data object identifying a 3-D structure and a number of branch reference data objects. The 3-D cell data structure also includes a number of branch data structures, each branch data structure including a data object identified one distinct circuit level from a number of circuit levels and a reference data object providing a pointer to a another data structure, where the other data structure includes a list of geometric shapes corresponding to the one distinct circuit level. The 3-D cell data structure also includes each branch reference data object from a number of branch reference data objects, where each branch reference data object provides a pointer to one branch data structure from a number of branch data structures. The number of circuit levels includes at least one 3-D design layer.

A 2-D hierarchical cell can be represented by a directed acyclic graph, or tree, in which the root cell has branches to child cells, each of which in turn may have branches to other child cells. The tree terminates at leaf cells, which have no branches. No cell in the tree may have a child that is also a member of its ancestral lineage to the root, as otherwise the graph would contain a cycle. Each cell in the tree represents a specific, distinct entity stored in the design database of the automated CAD program.

Figure 10:
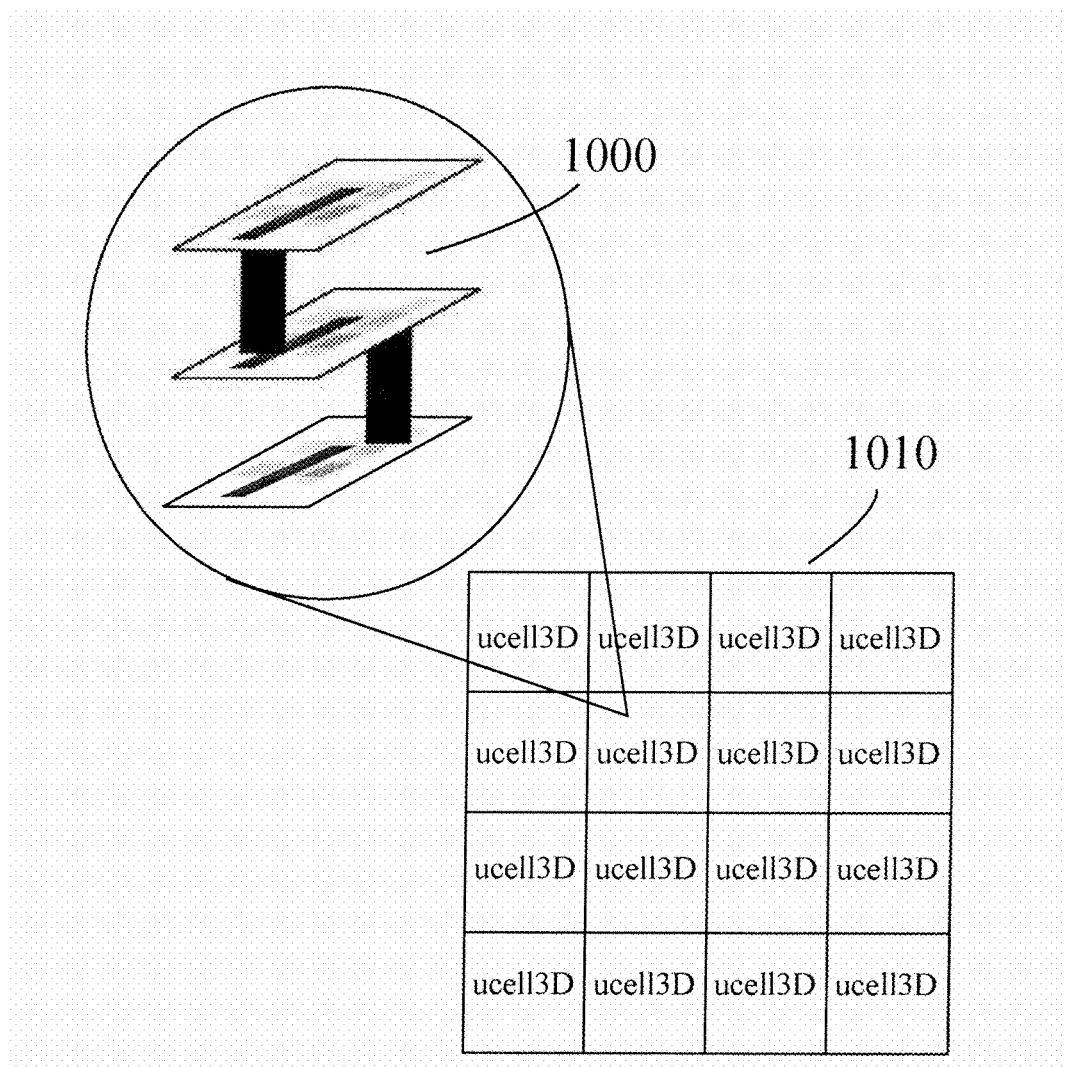
FIG. 10 illustrates a unit 3-D cell having geometry on three circuit levels and a 3-D hierarchical cell containing an arrangement of said 3-D unit cells.

The 2-D hierarchical tree structure, which is the foundation of conventional automated CAD programs for integrated circuit design, poses many practical problems for 3-D hierarchical design, however. To explain an example problematic case, reference is made to FIG. 10, in which there is diagrammatically illustrated a unit 3-D cell (1000) having drawn geometry on three circuit levels and representing a basic functional component of a larger circuit. This unit cell might be a portion of a 3-D integrated imaging circuit, in which one circuit level contains a photoreceptor, one level contains an analog-to-digital conversion circuit, and one level contains a digital processing circuit. Alternatively, the unit cell might be a 3-D integrated processor-in-memory circuit, in which one circuit level contains a group of charge storage cells, another level contains a processing element, and a third circuit level contains logic for reading from and writing to the cell. There is no limit to the number of possibilities that may be envisioned for the function embodied by the unit cell, or to the number of circuit levels that it contains. The central feature is that the combination of interconnected circuit levels forms a functional component that should be designed and verified as a single entity. After the unit 3-D cell is created in the design database, a larger hierarchical cell (1010), comprising some number of these unit cells, is built to form a core 3-D logic block.

Figure 11:
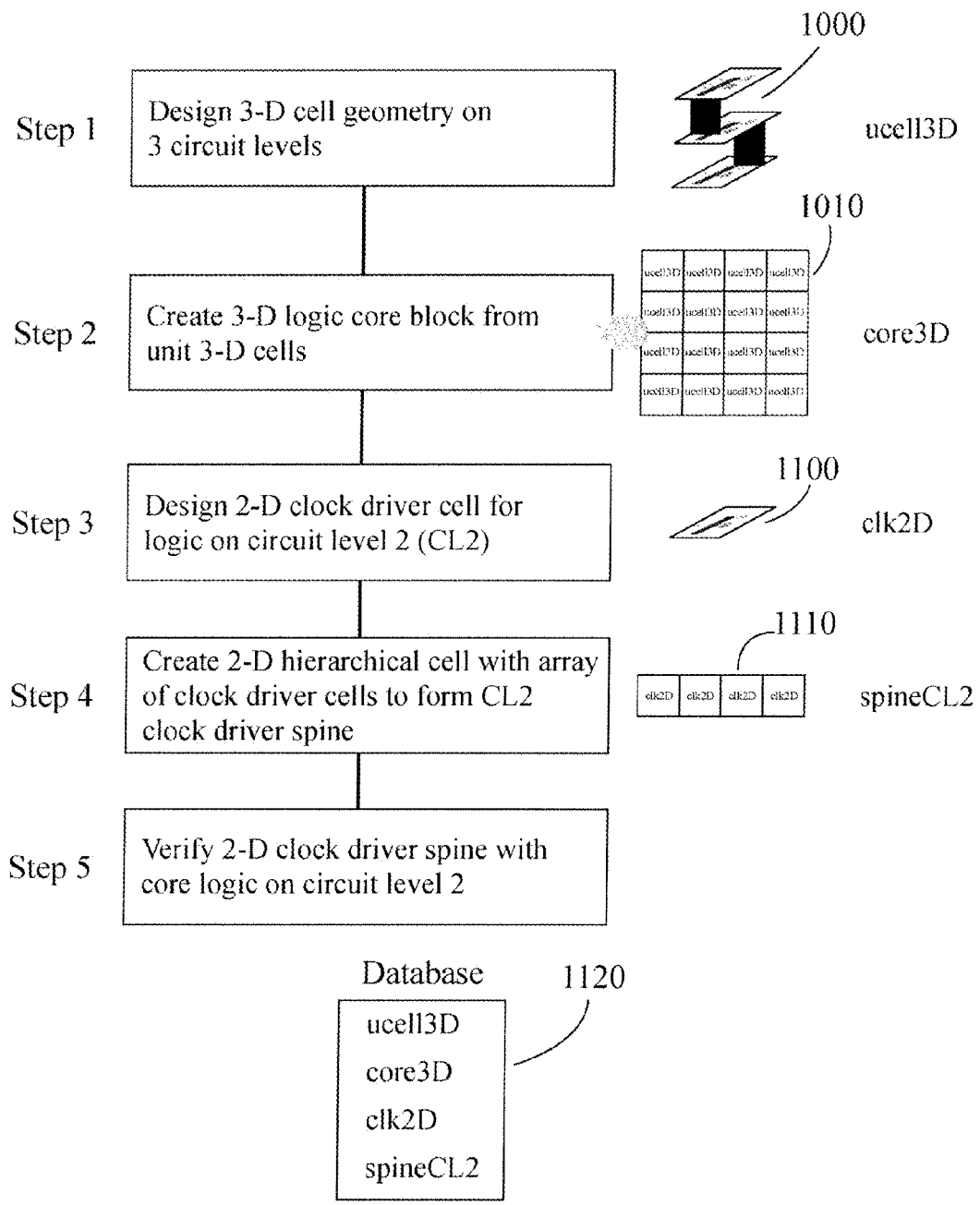
FIG. 11 is a block diagram depicting initial steps in the design process of a 3-D integrated circuit and containing illustrations of cells created in the design database.

FIG. 11 illustrates a sequence of design steps that would be followed in the example case to create a complete 3-D integrated circuit comprising the 3-D core logic block along with other 2-D cells required to drive circuits on one circuit level. Step 1 entails the design of the three-level unit cell, which is given the name 'ucell3D' in the database. Step 2 entails the creation of the core 3-D logic block, which is given the name 'core3D' in the database. In the next step, Step 3, the designer creates a 2-D logic cell specific to a particular circuit level. Such a cell might be a pre-charge circuit to initialize a memory circuit, or it might be a clock driver circuit to distribute signals on one circuit level, or it might embody any of an unlimited number of other functions. The central feature of the putative cell is that it interacts directly only with other cells on its same circuit level. For purposes of the example, this cell is said to represent a clock driver circuit (1100) for circuit level 2 of the complete 3-D integrated circuit, and is given the name 'clk2D' in the database. In Step 4 the designer creates an array of these clock driver cells to serve as the spine connecting to, and driving the components of, the core logic block on circuit level 2. This array (1110), which is a 2-D hierarchical cell, is given the name 'spineCL2' in the database. The contents of the design database at the end of Step 4 are listed at the bottom of FIG. 11.

The problem situation occurs when the designer reaches Step 5, in which the operation of the clock driver spine should be verified in conjunction with the core logic components on circuit level 2. It should be noted that there is no cell in the database containing only the circuit level 2 components of the core logic. The designer could create a 3-D hierarchical cell containing an instance of the 2-D array 'spineCL2' and an instance of the 3-D core 'core3D'. However, it would then be necessary to test all of the circuit levels at once, which would require considerably more time and resources than testing only the circuit level 2 functions. In order to proceed with the verification, the designer should have an efficient method to isolate the components specific to this particular slice of the 3-D circuit.

Figure 12:
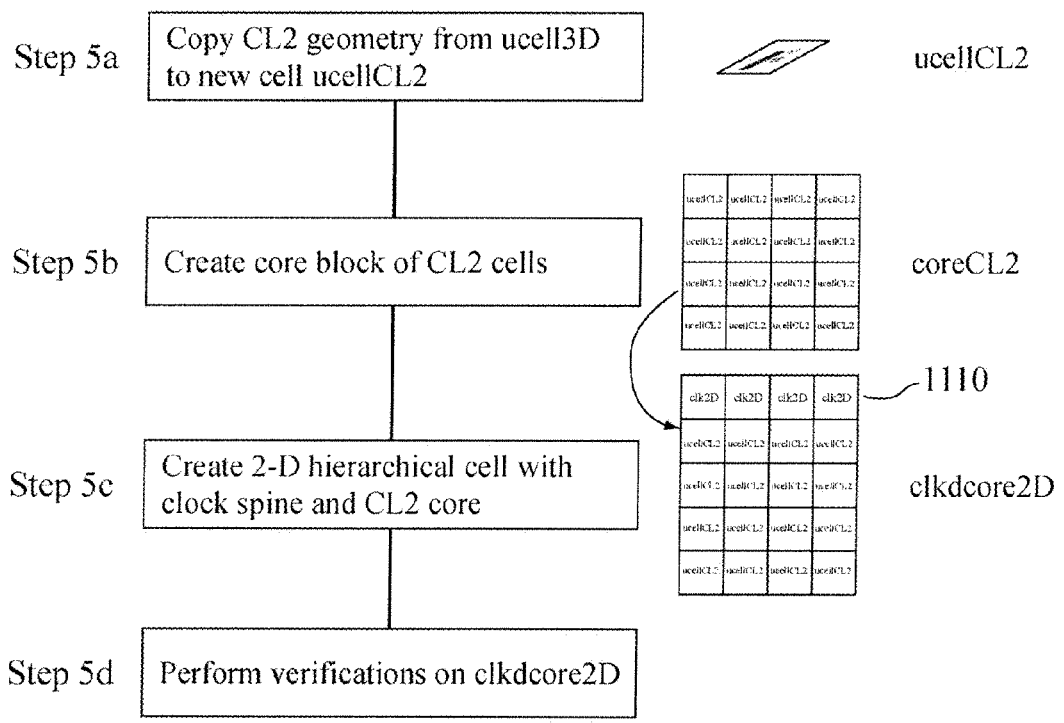
FIG. 12 is a block diagram depicting further detail in the design process of FIG. 11 according to prior art, in which 2-D logic cells are added to one circuit level of the 3-D integrated circuit, and containing illustrations of cells created in the design database.
Figure 12:
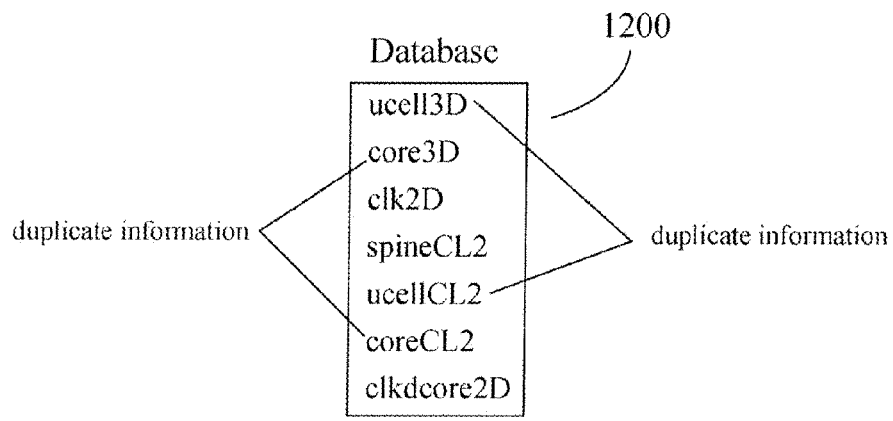

Using existing automated design tools, the designer should follow a sequence of steps similar to those depicted diagrammatically in FIG. 12. Step 5*a* entails the creation of a new 2-D cell containing a copy of the circuit level 2 geometry of the initial unit 3-D cell 'ucell3D'. This 2-D cell is given the name 'ucellCL2' in the database. Step 5*b* entails the creation of a new 2-D core logic block containing some number of instances of the unit 2-D cell 'ucellCL2'. The 2-D core logic block is given the name 'coreCL2' in the database and represents the image of the 3-D logic core restricted to circuit level 2. In Step 5*c*, the designer creates a 2-D hierarchical cell, given the name 'clkdcore2D', containing an instance of the clock driver spine (1110), 'spineCL2', and an instance of the circuit level 2 core logic cell, 'coreCL2'. In Step 5*d*, the designer proceeds with the verification procedures on the 'clkdcore2II cell. The contents of the design database at the end of this sequence of steps are listed at the bottom of FIG. 12. It should be noted that the entries 'ucell3D' and 'ucellCL2' contain duplicate information, as do the entries 'core3D' and 'coreCL2'. If errors are discovered in the verification process, each copy of the duplicated information should be updated.

An embodiment of the present invention teaches an alternative, more efficient method for organizing a 3-D hierarchical tree that does not require additional entries in the database, and thus provides greater simplicity in maintaining its integrity. The new method requires that one be able to reference the projection of a 3-D cell onto a single circuit level by direct reference to the original 3-D cell as explained below.

Figure 13:
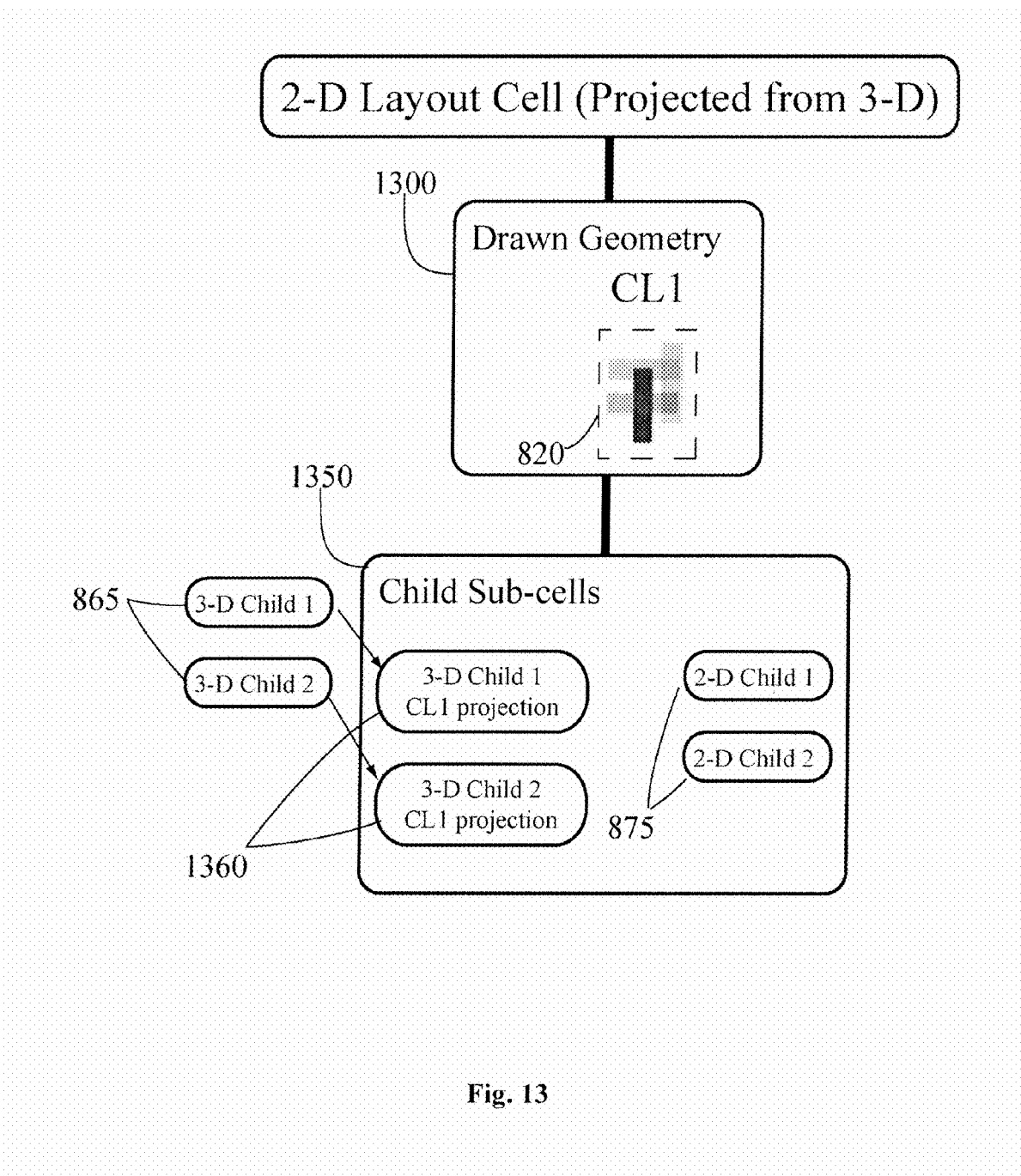
FIG. 13 illustrates diagrammatically the implicit 2-D hierarchical cell representing the projection of the 3-D hierarchical cell of FIG. 8 onto one circuit level.

The term "circuit level projection" used herein denotes a 2-D hierarchical cell comprising all elements of a 3-D cell for a single circuit level at the same depth of hierarchy as in the original cell. Referring to FIG. 13, there is diagrammatically illustrated the projection of the 3-D hierarchical cell structure of FIG. 8 onto its CL1 circuit level. The Drawn Geometry segment (1300) of the resulting 2-D cell points to the same data structure containing the CL1 layer geometry (820) of the 3-D cell. Any changes made to this geometry will thus be reflected in both the 3-D and the projected 2-D cell views. The Child sub-cells segment (1350) of the projected 2-D cell contains pointers to the same 2-D child cells (875) instantiated for circuit level CL1 in the 3-D cell. The 3-D child sub-cells (865) of the originating 3-D cell do not appear directly as children. Instead, their 2-D projections onto CL1 (1360) are referenced as child sub-cells of the projected 2-D cell.

It can be readily seen that the structure of the 3-D hierarchical cell as defined herein above provides a means to efficiently address a circuit level projection by reference to the 3-D cell. It is necessary only to add a set of pointers that address the drawn geometry and the child sub-cells by level. The circuit level projections of the 3-D child sub-cells are referenced recursively in the same manner as for the parent. In other words, each of the projected 3-D child sub-cells (1360) references a separate 2-D layout cell having substantially the same structure depicted in FIG. 13 for the parent.

Figure 14:
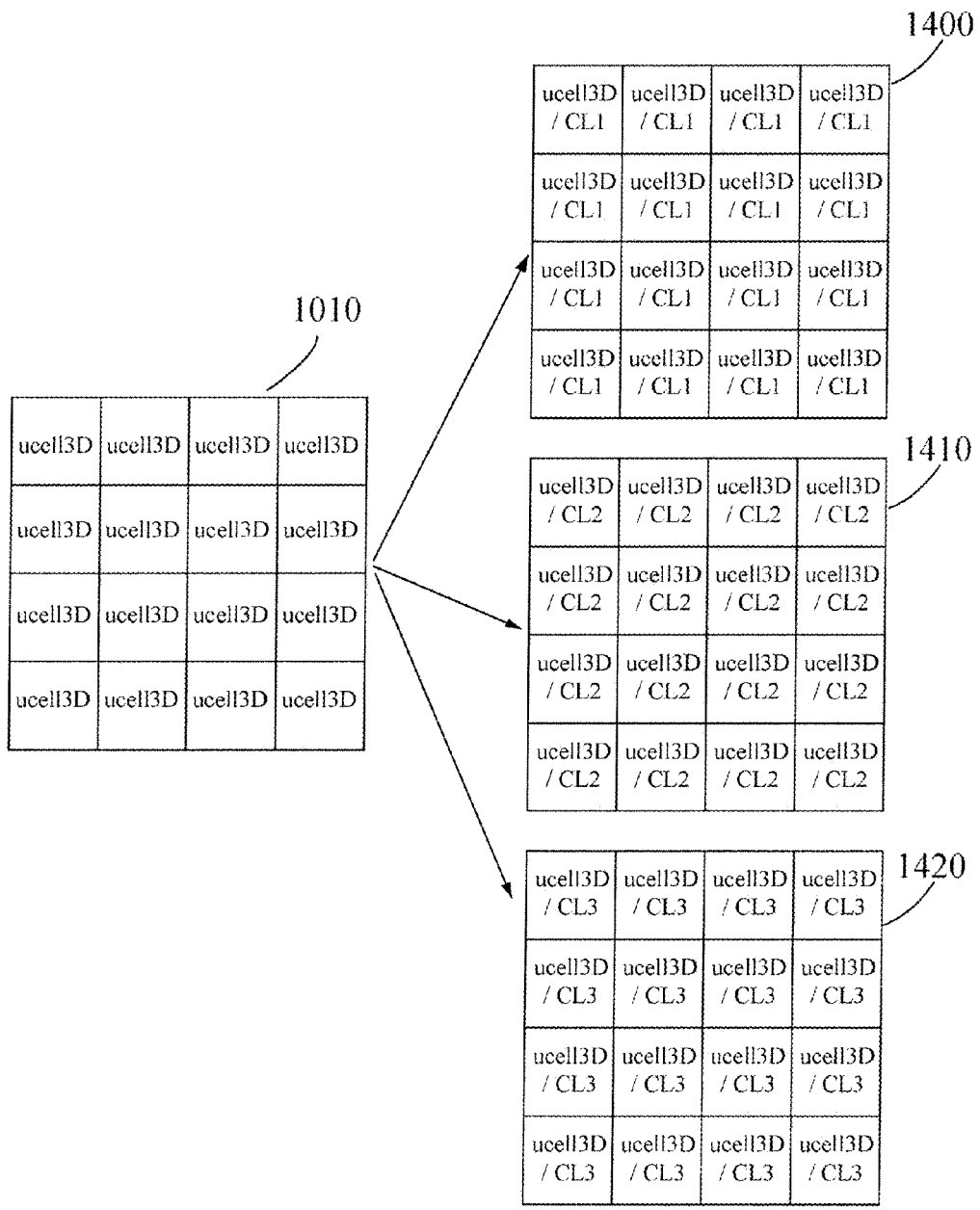
FIG. 14 illustrates diagrammatically the implicit 2-D hierarchical cells representing the projections of the 3-D hierarchical cell of FIG. 10 onto its three circuit levels.
Figure 15:
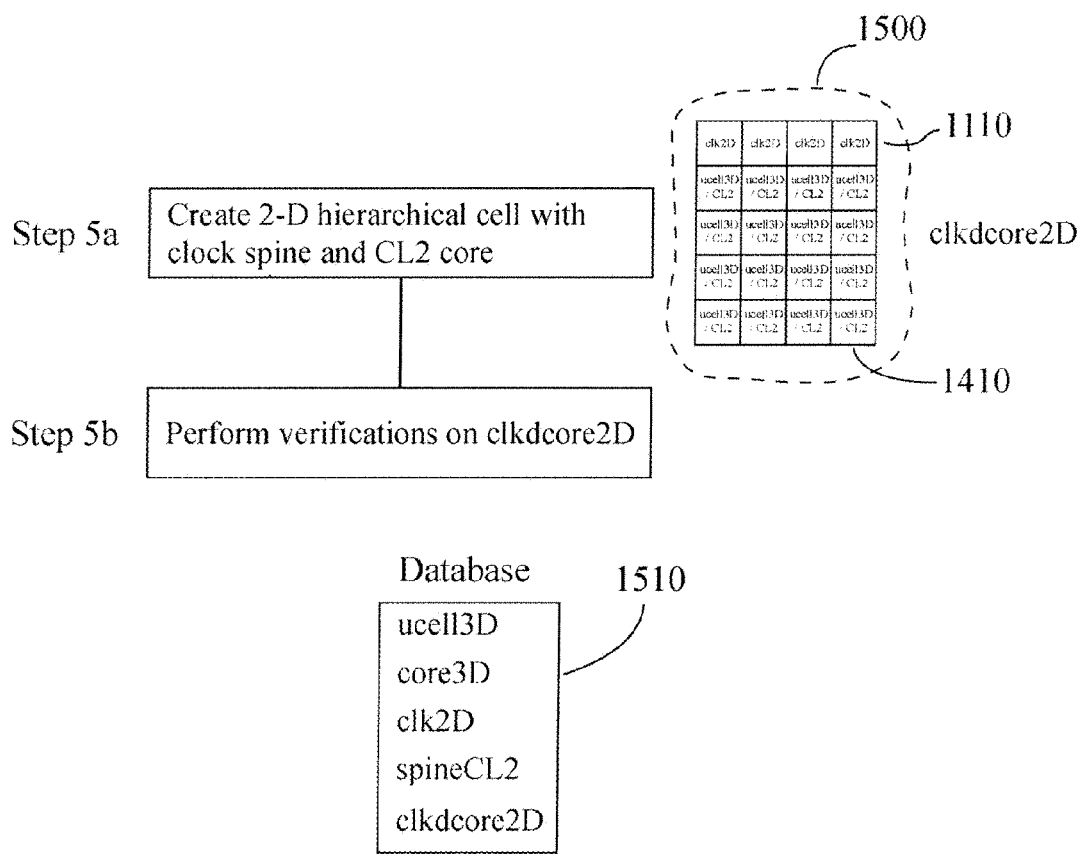
FIG. 15 is a block diagram depicting further detail in the design process of FIG. 11 according to the present invention, in which 2-D logic cells are added to one circuit level of the 3-D integrated circuit, and containing illustrations of cells created in the design database.

Referring to FIG. 14, there are diagrammatically illustrated the 2-D projections of the 3-D hierarchical structure (1010), representing the core 3-D logic block of the example design onto each circuit level CL1 (1400), CL2 (1410) and CL3 (1420). Having thus augmented the 3-D cell data structure with a means to reference each circuit level projection, the procedure to verify the circuit level 2 logic of the example design problem is greatly simplified. FIG. 15 diagrammatically depicts the steps of the procedure according to the current invention. In the new Step 5*a*, the designer creates a 2-D hierarchical cell (1500), given the name 'clkdcore2D', containing an instance of the clock driver spine (1110), 'spineCL2', and an instance of the circuit level 2 projection (1410) of the core 3-D block. In the new Step 5*b*, the designer proceeds with the verification procedures on the 'clkdcore2D' cell in the same manner as in the prior art Step 5*d* procedure. It is noted that no cells containing duplicate information are created in the database following the new procedure.

Figure 16A:
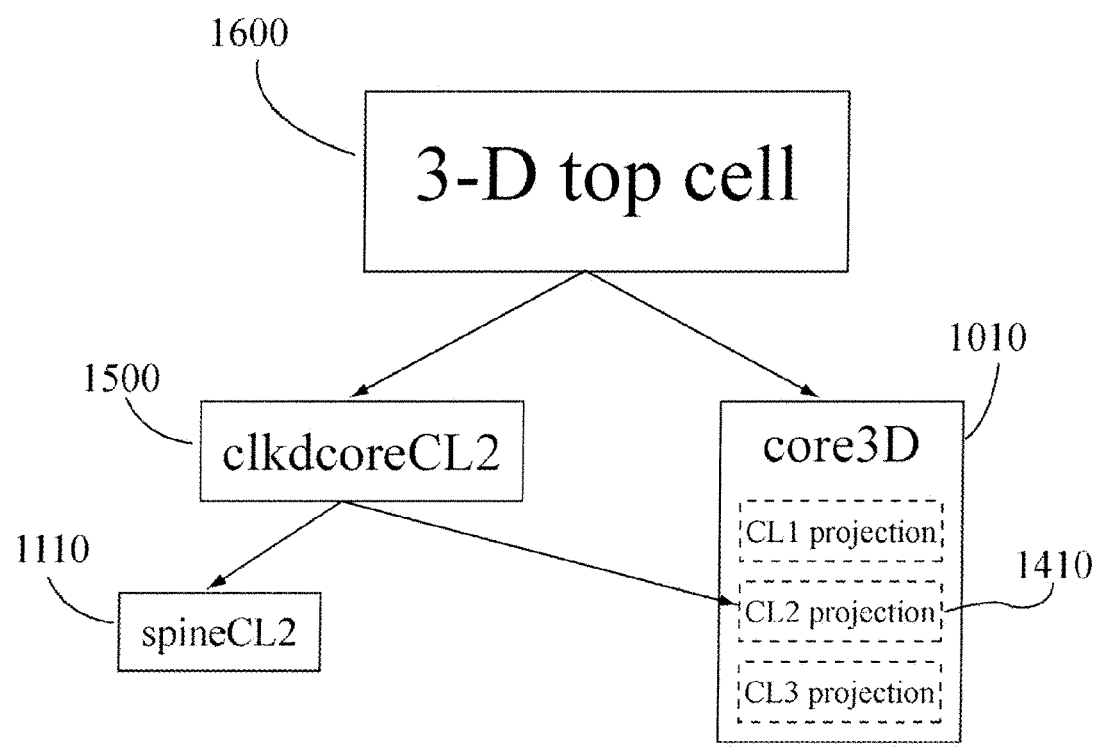
FIG. 16a is a block diagram illustrating one embodiment of a hierarchical tree structure of a 3-D integrated circuit containing as children one instance of another 3-D hierarchical cell and one instance of a 2-D hierarchical cell, the latter containing a child that is a 2-D circuit level projection of its sibling 3-D hierarchical cell.
Figure 16B:
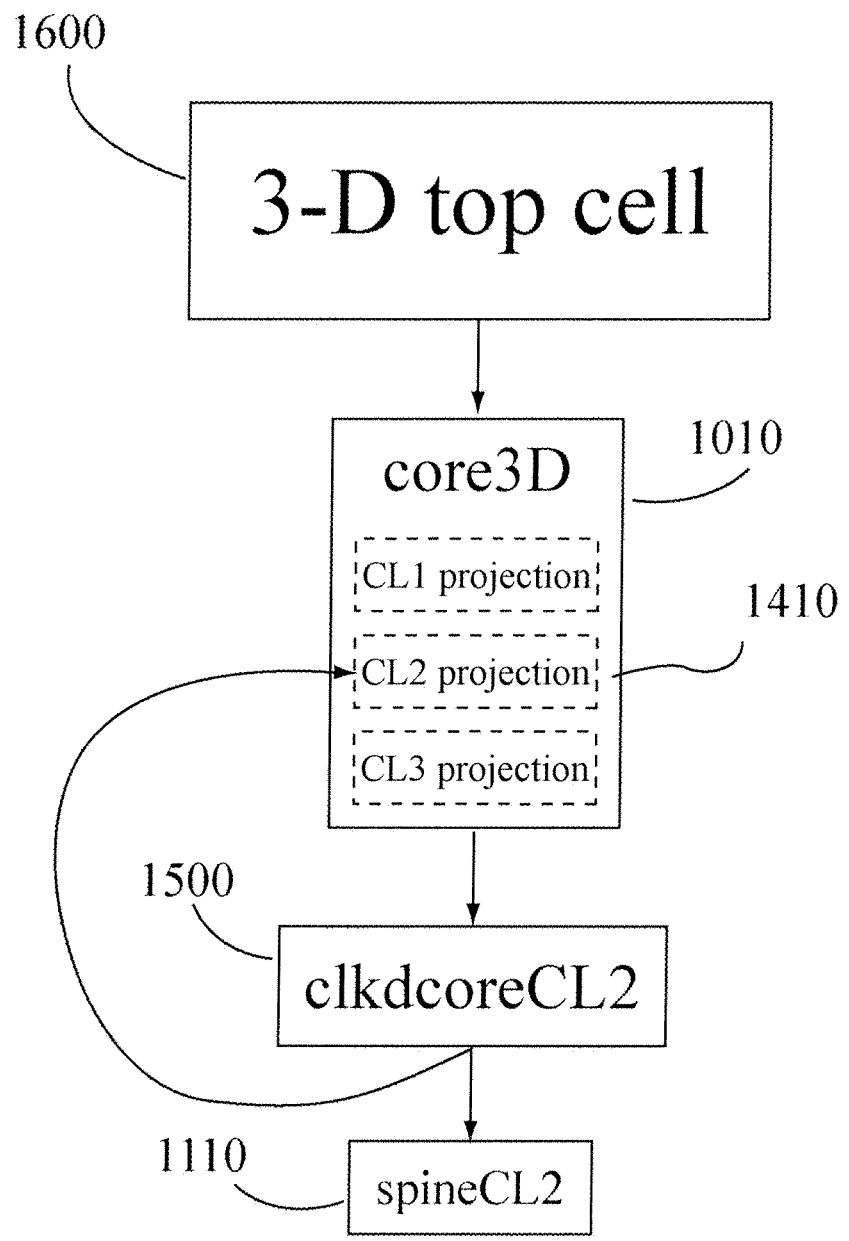
FIG. 16b is a block diagram illustrating one embodiment of a hierarchical tree structure of a 3-D integrated circuit containing one child instance of another 3-D hierarchical cell, which itself contains one child instance of a 2-D hierarchical cell, the latter containing a child that is a 2-D circuit level projection of its parent 3-D hierarchical cell.

Referring to FIGS. 16*a* and 16*b*, there are diagrammatically illustrated two embodiments of a 3-D hierarchical tree structure representing the top-level 3-D integrated circuit containing both the core 3-D logic block and the 2-D clock driver core for circuit level 2 as child cells in the tree. In FIG. 16*a*, the child cells 'clkdcore2D' (1500) and 'core3D' (1010) are siblings because they are at the same depth from the root. In FIG. 16*b*, the 'clkdcore2D' cell (1500) is a child of the 'core3D' cell (1010) although the former has a child sub-cell that is a projection of the latter. This arrangement does not create a cyclic reference because the projection (1410) is not a parent or other ancestor of the 2-D 'clkdcore2D' cell (1500).

It is noted that once a circuit level projection of a 3-D cell is instantiated within a 2-D cell, the 2-D cell cannot thereafter be instantiated as a child of a 3-D parent at a different level.

In one embodiment, the method of these teachings for defining a data structure includes providing a number of data objects (a first group of data objects) stored in a computer usable medium, where each data object identifies one circuit level from a number of circuit levels, and providing a corresponding reference data object for each data object, where the corresponding reference data object provides a pointer to a data structure including a list of geometric shapes, where the number of circuit levels includes at least one 3-D design layer. In one instance, the method also includes providing a second group of data objects, where each data object from the second group of data objects identifies of as a child cell, and providing a second group of corresponding reference data object for each one of the data objects from the second group of data objects, where each corresponding reference data object from the second group of corresponding data objects provides a pointer to one data object from the first group of data objects. The pointer to the data object identifies a circuit level. The child cell identified by the data object from the second group is assigned to that circuit level identified by the data object from the first group. In one instance, a single data object from the first group of data objects is provided for 3-D material layers.

In another embodiment, the method includes providing a second corresponding reference data object for each data object from the first group of data objects, where the second corresponding reference data object provides a pointer to a data structure, the data structure including a list of child cells, wherein one list of child cells is a list of 3-D child cells. In one instance, the method also includes providing a circuit level projection of a 3-D child cell onto a circuit level and including an identifier for this circuit level projection in the list of child cells, where the list of child cells is referenced by the second corresponding reference data object. In another instance, the method includes providing a circuit level projection of a 3-D child cell onto a selected circuit level, providing a data object of a third group of other data objects, where the data object of a third group of other data objects identifies the circuit level projection of a 3-D child cell, and providing another corresponding reference data object for the data object of a third group of other data objects, the other corresponding reference data object providing a pointer to the data object from first group of data objects, the pointer pointing to the one data object identifying the selected circuit level.

Having implemented the methods and systems relevant to creating the data structures seen thus far for the 3-D technology file and for the 3-D hierarchical cell and tree organizations, the methods for utilizing these structures within a computer-aided integrated circuit design program are readily derived. The basic functions required for creating mask artwork for a 3-D integrated circuit are (1) creating new layout cells; (2) drawing geometry; and (3) instantiating child cells within a parent cell. Methods for performing these functions exist already in conventional 2-D integrated circuit layout CAD programs. Described below are embodiments that augment conventional methods for the purpose of implementing a 3-D integrated circuit layout CAD program.

Figure 17C:
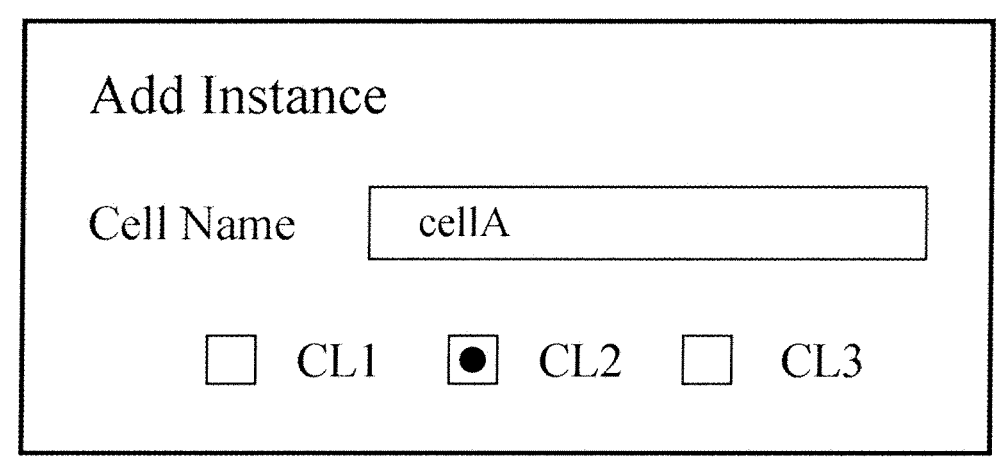

An embodiment of the method to create a new layout cell with a given technology, either the 3-D parent technology or one of the 2-D sub-technologies, should be provided. One embodiment of this method provides an interactive menu to the user, such as the prototype menu illustrated in FIG. 17a. By selecting the technology, the user automatically identifies the cell as a 3-D cell or as a 2-D cell.

An embodiment of the method for selecting the circuit level should be added within the drawing function when laying out geometry for a 3-D cell. In one instance, this method provides an interactive menu to the user, such as the prototype menu illustrated in FIG. 17b. Once the 3-D or the 2-D circuit level is selected, the user should be presented with a palette of drawing layers defined in the technology assigned to the given level. It is noted that this menu selection should be enabled only for 3-D cell layout. 2-D cells are allowed to draw shapes only for layers defined in their specific technology.

An embodiment of the method for adding child instances on a specified circuit level should be added to permit 2-D child cells to be instantiated within a parent 3-D cell. It is also necessary to add a method that permits instantiating a 2-D circuit level projection of a 3-D cell within a 2-D parent. One embodiment of both methods provides an interactive menu to the user, such as the prototype menu illustrated in FIG. 17c. It is noted that these embodiments are not required to instantiate a 3-D child within a 3-D parent, or to instantiate a 2-D child within a 2-D parent. Existing methods suffice for these latter functions.

As detailed above, in one embodiment, the method of these teachings for layout for a 3-D integrated circuit includes identifying a dimensionality of a cell and selecting a circuit level for a 3-D cell. In one instance, the method can include providing an instantiation of a 2-D child cell within the 3-D cell. In another instance, the method can also include providing an instantiation of a 2-D circuit level projection of a 3-D cell within a 2-D cell.

In one embodiment, the method of these teachings is performed via a graphical user interface in a computer system.

In one embodiment, a user interface of these teachings for identifying a cell and a technology utilized in that cell in a layout of a 3-D integrated circuit includes a component capable of enabling input of a cell name for a cell and a component capable of selecting a technology for said cell.

In another embodiment, a user interface of these teachings includes a component capable of selecting a circuit level for a 3-D cell.

"Component" as used herein refers to means for selecting options in graphical user interfaces (GUIs) such as, but not limited to, menus, pull down menus, drag and drop between dialog boxes, and other selecting means (see, for example, C. Petzold, Programming Windows, ISBN 1-57231-995-X, Ch. 9, Ch. 10, Ch. 11, pp. 357-566).

In one instance, a computer readable code causes one or more processors to implement the user interface of these teachings.

In one embodiment, a system for layout for a 3-D integrated circuit, similar to the system shown in FIG. 6g, includes one or more processors, a display and a computer usable medium having a computer readable code embodied therein that causes the one or more processors to implement a user interface of these teachings.

Automated design programs for 3-D integrated circuit layout will have the same requirements as those for 2-D integrated circuit layout for verifying correctness of the layout. Methods for performing verifications such as physical design rule checking and netlist extraction and comparison are well established in the current art of 2-D circuit design automation. The 3-D technology file structure provides the means to define rules for electrical and physical interactions between geometries for 3-D design layers and 2-D design layers on specific circuit levels. The 3-D hierarchical tree organization provides the means to traverse the design hierarchy laterally, on the same circuit level, or vertically across circuit levels. It should be noted that existing 2-D verification methods may be readily extended to 3-D integrated circuit design using the methods disclosed in this invention by appropriate reference to the 3-D data structures.

Each computer program may be implemented in any programming language, such as assembly language, machine language, a high-level procedural programming language, an object-oriented programming language, or a combination thereof. The programming language may be a compiled or interpreted programming language.

Each computer program may be implemented in a computer program product tangibly embodied in a computer-readable storage device for execution by a computer processor. Method steps of the invention may be performed by a computer processor executing a program tangibly embodied on a computer-readable medium to perform functions of the invention by operating on input and generating output.

Common forms of computer-readable (computer usable) media include, for example, a floppy disk, a flexible disk, hard disk, magnetic tape, or any other magnetic medium, a CDROM, any other optical medium, punched cards, paper tape, any other physical medium with patterns of holes or other patterns, a RAM, a PROM, and EPROM, a FLASH-EPROM, any other memory chip or cartridge, a carrier wave, such as electromagnetic radiation or electrical signals, or any other medium from which a computer can read.

Although the invention has been described with respect to various embodiments, it should be realized this invention is also capable of a wide variety of further and other embodiments within the spirit and scope of the appended claims.

What is claimed is:

1. A method for defining a technology file structure for use in a computer system specially configured for designing a 3-D semiconductor device, the method comprising the steps of:

constructing a 3-D technology file in the computer system by, providing in the computer system a first circuit level identifier for a first circuit level in a semiconductor device comprising multiple levels of semiconductor substrates;

providing in the computer system a second circuit level identifier for a second circuit level in the semiconductor device comprising multiple levels of semiconductor substrates;

providing in the computer system a first 2-D technology file identifier for a 2-D technology file containing technology dependent information corresponding to the first circuit level in the semiconductor device comprising multiple levels of semiconductor substrates;

providing in the computer system a second 2-D technology file identifier for a 2-D technology file containing technology dependent information corresponding to the second circuit level in the semiconductor device comprising multiple levels of semiconductor substrates; and creating, in the computer system, the 3-D technology file configured for use in generating a layout of the 3-D semiconductor device comprising multiple levels of semiconductor substrates, the file structure comprising the first circuit level identifier, the first 2-D technology file identifier, the second circuit level identifier and the second 2-D technology file identifier.

2. The method of claim 1, wherein the 2-D technology file identifier comprises a pointer to the 2-D technology file.

3. The method of claim 1, further comprising a step of assigning a 2-D technology to each of the first circuit level and the second circuit level.

4. The method of claim 1, wherein the 2-D technology file comprises a pre-existing 2-D technology file.

5. The method of claim 1, further comprising a step of providing an identifier for a bond layer disposed between the first circuit level and the second circuit level.

6. The method of claim 5, further comprising a step of providing a list comprising the first circuit level identifier, the second circuit level identifier and the identifier for the bond layer; the first circuit level identifier, the second circuit level identifier and the identifier for the bond layer being located in an order in which the first circuit level, the second circuit level and the bond layer are located in the 3-D semiconductor device comprising multiple levels of semiconductor substrates.

7. The method of claim 6, further comprising a step of generating, in the computer system, a 3-D integrated circuit layout for the 3-D semiconductor device comprising multiple levels of semiconductor substrates in accordance with the list.

8. The method of claim 1, further comprising a step of verifying a 3-D integrated circuit layout for the 3-D semiconductor device comprising multiple levels of semiconductor substrates in accordance with the file structure.

9. The method of claim 1, wherein in at least one of the steps of providing in the computer system the first circuit level identifier for the first circuit level, and the step of providing in the computer system a second circuit level identifier for a second circuit level in the 3-D semiconductor device comprising multiple levels of semiconductor substrates involves at least one of the first circuit level or the second circuit level having active devices.

10. The method of claim 1, wherein the 3-D technology file is configured for use in verifying a 3-D integrated circuit layout.

11. The method of claim 1, wherein the multiple levels of semiconductor substrates are vertically stacked.

12. A system, comprising:
 at least one processor;
 a computer usable medium for storing data for access by computer readable code being executed on said at least one processor, said computer usable medium comprising:
  a data structure stored in said computer readable medium, said data structure including:
   a first circuit level identifier for a first circuit level in a semiconductor device comprising multiple levels of semiconductor substrates;
   a second circuit level identifier for a second circuit level in the semiconductor device comprising multiple levels of semiconductor substrates;
   a first 2-D technology file identifier for a 2-D technology file containing technology dependent information corresponding to the first circuit level in the semiconductor device comprising multiple levels of semiconductor substrates;
   a second 2-D technology file identifier for a 2-D technology file containing technology dependent information corresponding to the second circuit level in the semiconductor device comprising multiple levels of semiconductor substrates; and
   a file structure configured for use in generating a layout of the semiconductor device comprising multiple levels of semiconductor substrates, the file structure comprising the first circuit level identifier, the first 2-D technology file identifier, the second circuit level identifier and the second 2-D technology file identifier.

13. The system of claim 12, wherein at least one of the first 2-D technology file identifier and second 2-D technology file identifier comprises a pointer to a respective 2-D technology file.

14. The system of claim 12, wherein at least one of the first 2-D technology file identifier and second 2-D technology file identifier comprises an identifier for a bond layer disposed between the first circuit level and the second circuit level.

15. The system of claim 12, wherein the 2-D technology file comprises a pre-existing 2-D technology file.

16. The system of claim 12, further comprising a list comprising the first circuit level identifier, the second circuit level identifier and the identifier for the bond layer; the first circuit level identifier, the second circuit level identifier and the identifier for the bond layer being located in an order in which the first circuit level, the second circuit level and the bond layer are located in the semiconductor device comprising multiple levels of semiconductor substrates.

17. The system of claim 12, wherein the data structure stored in said computer readable medium is used to develop a 3-D integrated circuit layout for the semiconductor device comprising multiple levels of semiconductor substrates.

18. The system of claim 12, wherein the data structure stored in the computer readable medium is used to verify a 3-D integrated circuit layout.

19. The system of claim 12, wherein at least one of the first circuit level identifier for the first circuit level, and the second circuit level identifier for a second circuit level in the semiconductor device comprising multiple levels of semiconductor substrates involves at least one of the first circuit level or the second circuit level having active devices.

20. The system of claim 12, wherein the multiple levels of semiconductor substrates are vertically stacked.

* * * * *